US012721125B2

(12) United States Patent
Wang et al.

(10) Patent No.: US 12,721,125 B2
(45) Date of Patent: Aug. 25, 2026

(54) INTERCONNECT STRUCTURE WITH DIELECTRIC CAP LAYER AND ETCH STOP LAYER STACK

(71) Applicant: Taiwan Semiconductor Manufacturing Co., Ltd., Hsinchu (TW)

(72) Inventors: Chao-Chun Wang, Hsinchu (TW); Jen Hung Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 408 days.

(21) Appl. No.: 18/301,577

(22) Filed: Apr. 17, 2023

(65) Prior Publication Data

US 2023/0253247 A1 Aug. 10, 2023

Related U.S. Application Data

(62) Division of application No. 17/210,015, filed on Mar. 23, 2021, now Pat. No. 11,658,064.

(60) Provisional application No. 63/084,812, filed on Sep. 29, 2020.

(51) Int. Cl.
*H10W 20/00* (2026.01)
*H10W 20/41* (2026.01)

(52) U.S. Cl.
CPC ....... *H10W 20/076* (2026.01); *H10W 20/057* (2026.01); *H10W 20/075* (2026.01); *H10W 20/425* (2026.01)

(58) Field of Classification Search
CPC ......... H01L 21/76834; H01L 21/76832; H01L 21/76831; H01L 21/76879; H01L 21/76897; H01L 23/53238; H01L 23/5226; H10W 20/077; H10W 20/076; H10W 20/075; H10W 20/057; H10W 20/425; H10W 20/081; H10W 20/069; H10W 20/056; H10W 20/037
See application file for complete search history.

(56) References Cited

U.S. PATENT DOCUMENTS 9,812,390 B2 11/2017 Yang et al.
9,941,199 B2 4/2018 Lee et al.
10,854,505 B2 12/2020 Chen et al.
11,322,396 B2 5/2022 Tung et al.
(Continued)

FOREIGN PATENT DOCUMENTS

CN 101079408 A 11/2007
CN 102623434 A 8/2012
(Continued)

*Primary Examiner* — John M Parker
(74) *Attorney, Agent, or Firm* — Slater Matsil, LLP

(57) ABSTRACT

A method of forming a semiconductor device includes: forming a first conductive feature in a first dielectric layer disposed over a substrate; forming a metal cap layer over an upper surface of the first conductive feature distal from the substrate; selectively forming a dielectric cap layer over an upper surface of the first dielectric layer and laterally adjacent to the metal cap layer, wherein the metal cap layer is exposed by the dielectric cap layer; and forming an etch stop layer stack over the metal cap layer and the dielectric cap layer, wherein the etch stop layer stack comprises a plurality of etch stop layers.

20 Claims, 14 Drawing Sheets

(56) References Cited

U.S. PATENT DOCUMENTS

| | | | |
|---|---|---|---|
| 11,380,542 B2 | 7/2022 | Chi et al. | |
| 11,665,971 B2 | 5/2023 | Peng et al. | |
| 2002/0182855 A1* | 12/2002 | Agarwala | H01L 23/5283 257/E23.152 |
| 2006/0226549 A1 | 10/2006 | Yu et al. | |
| 2008/0179741 A1 | 7/2008 | Streck et al. | |
| 2009/0246952 A1 | 10/2009 | Ishizaka et al. | |
| 2009/0250815 A1 | 10/2009 | Yang et al. | |
| 2010/0029071 A1 | 2/2010 | Russell et al. | |
| 2010/0029078 A1 | 2/2010 | Russell et al. | |
| 2012/0068344 A1* | 3/2012 | Bonilla | H01L 21/76862 438/618 |
| 2013/0277853 A1 | 10/2013 | Yang et al. | |
| 2014/0332960 A1 | 11/2014 | Yang et al. | |
| 2015/0170961 A1 | 6/2015 | Romero et al. | |
| 2016/0093668 A1 | 3/2016 | Lu et al. | |
| 2016/0268194 A1 | 9/2016 | Yu et al. | |
| 2017/0278742 A1 | 9/2017 | Chen et al. | |
| 2019/0305107 A1 | 10/2019 | Chen et al. | |

FOREIGN PATENT DOCUMENTS

| | | |
|---|---|---|
| CN | 103972208 A | 8/2014 |
| CN | 106601664 A | 4/2017 |
| CN | 107230660 A | 10/2017 |
| KR | 20050106916 A | 11/2005 |
| KR | 20140097068 A | 8/2014 |
| KR | 20190062132 A | 6/2019 |
| KR | 20190109352 A | 9/2019 |
| KR | 20200037058 A | 4/2020 |
| TW | 200636802 A | 10/2006 |
| TW | 201123346 A | 7/2011 |
| TW | 201616608 A | 5/2016 |

* cited by examiner 100B
148
145
143
139
137
127
118
125
123
119
117
111
109
107
146
133
116
113
135
115
136
138
105
103
101
112

INTERCONNECT STRUCTURE WITH DIELECTRIC CAP LAYER AND ETCH STOP LAYER STACK

PRIORITY CLAIM AND CROSS-REFERENCE

This application is a divisional of U.S. patent application Ser. No. 17/210,015, filed Mar. 23, 2021, entitled "Interconnect Structure with Dielectric Cap Layer and Etch Stop Layer Stack", which claims the benefit of the U.S. Provisional Application No. 63/084,812, filed Sep. 29, 2020 and entitled "ESL Film Scheme Designed for Yield, Reliability Improvement," which applications are hereby incorporated herein by reference.

BACKGROUND

High-density integrated circuits, such as Very Large Scale Integration (VLSI) circuits, are typically formed with multiple metal interconnects to serve as three-dimensional wiring line structures. The purpose of the multiple interconnects is to properly link densely packed devices together. With increasing levels of integration, a parasitic capacitance effect between the metal interconnects, which leads to RC delay and cross-talk, increases correspondingly. In order to reduce the parasitic capacitance and increase the conduction speed between the metal interconnections, low-k dielectric materials are commonly employed to form Inter-Layer Dielectric (ILD) layers and Inter-Metal Dielectric (IMD) layers.

Metal lines and vias are formed in the IMD layers. A formation process may include forming an etch stop layer over first conductive features, and forming a low-k dielectric layer over the etch stop layer. The low-k dielectric layer and the etch stop layer are patterned to form a trench and a via opening. The trench and the via opening are then filled with a conductive material, followed by a planarization process to remove excess conductive material, so that a metal line and a via are formed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
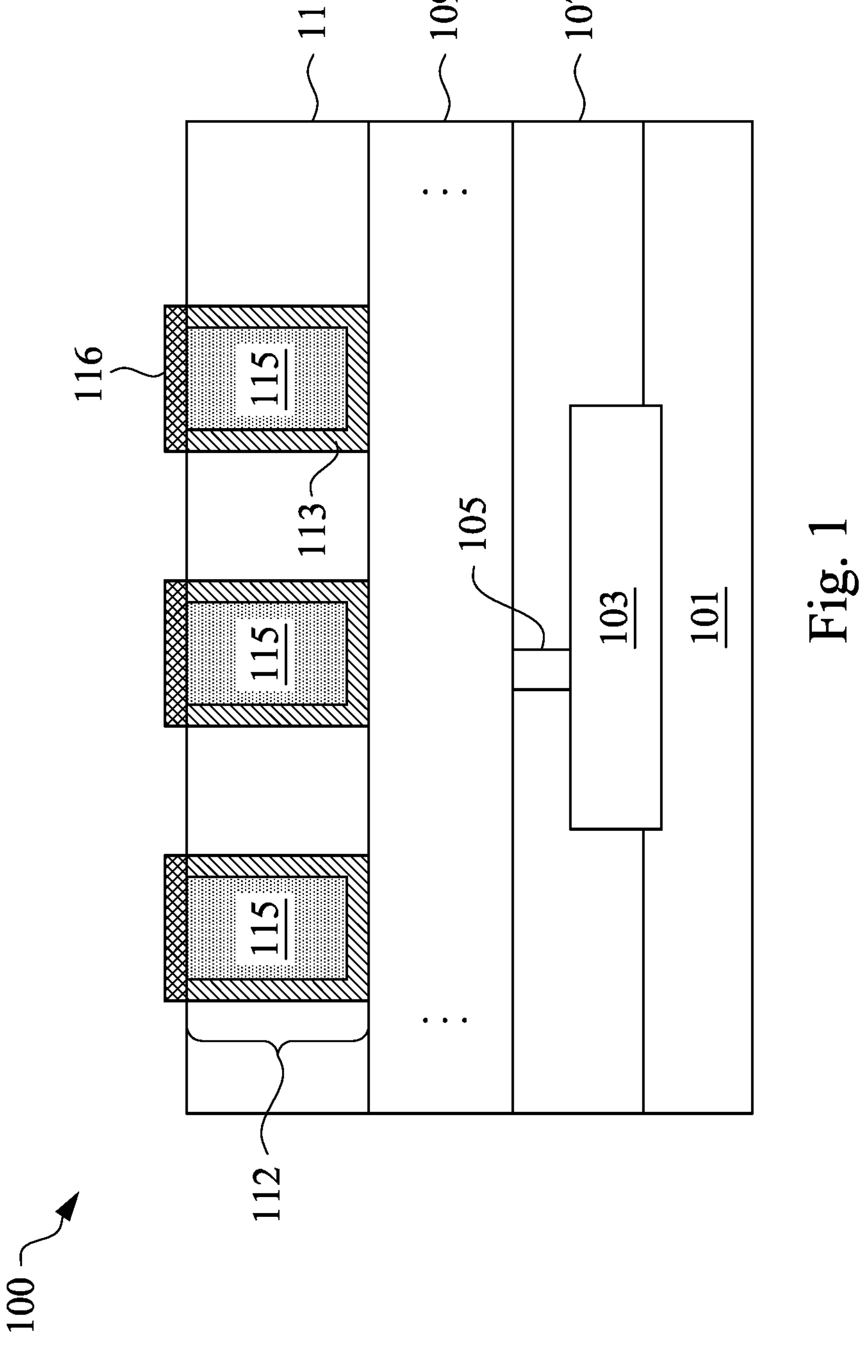
FIGS. 1 through 7 illustrate cross-sectional views of a semiconductor device at various stages of manufacturing, in accordance with an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the description herein, unless otherwise specified, the same or similar reference numerals in different figures refer to the same or similar element formed by a same or similar formation method using a same or similar material(s).

An interconnect structure of a semiconductor device and the method of forming the same are provided in accordance with some embodiments. In accordance with some embodiments of the present disclosure, the formation of an interconnect structure includes forming a metal cap layer over a first conductive feature (e.g., a conductive line) that is disposed in a first dielectric layer. A dielectric cap layer, which is a nitride-containing dielectric material, is selectively formed on the upper surface of the first dielectric layer and laterally adjacent to the metal cap layer. The dielectric cap layer may be formed by a selectively deposition process or by an ion implantation process. The dielectric cap layer reduces leakage current paths between adjacent conductive lines in the first dielectric layer at the interface between the first dielectric layer and a subsequently formed second dielectric layer, and improves the Time-Dependent Dielectric Brakedown (TDDB) performance. Next, an etch stop layer stack, which includes a plurality of etch stop layers (e.g., three or four etch stop layers), is formed on the dielectric cap layer and the metal cap layer. In some embodiments, the etch stop layer stack includes an aluminum nitride layer, a first aluminum oxide layer, an oxygen-doped silicon carbide (ODC) layer, and a second aluminum oxide layer formed successively over the dielectric cap layer and the metal cap layer. The film scheme of the etch stop layer stack achieves various advantages. For example, the etch stop layer stack prevents copper in the first conductive feature from diffusing upward into the etch stop layers and the overlying second dielectric layer. The upward diffusion of copper may reduce the etching rates of the second dielectric layer and the etch stop layer stack in subsequent etching process to form vias, and the reduced etching rates may cause the etching of via openings to stop prematurely, thus resulting in failure in the electrical connection between the vias and the underlying conductive lines. The film scheme of the etch stop layer prevents the above issue by preventing copper diffusion. Additional advantages include better etch selectivity window and further reduced leakage current.

FIGS. 1 through 7 illustrate cross-sectional views of a semiconductor device 100 at various stages of manufacturing, in accordance with an embodiment. The semiconductor device 100 may be a device wafer including active devices (e.g., transistors, diodes, or the like) and/or passive devices (e.g., capacitors, inductors, resistors, or the like). In some embodiments, the semiconductor device 100 is an interposer wafer, which may or may not include active devices and/or passive devices. In accordance with yet another embodiment of the present disclosure, the semiconductor device 100 is a package substrate strip, which may be package substrates with cores therein or may be core-less package substrates. In subsequent discussion, a device wafer is used as an example of the semiconductor device 100. The teaching of the present disclosure may also be applied to interposer wafers, package substrates, or other semiconductor structures, as skilled artisans readily appreciate.

As illustrated in FIG. 1, the semiconductor device 100 includes a semiconductor substrate 101 and integrated circuit devices 103 (e.g., active devices, passive devices) formed on or in the semiconductor substrate 101 (may also be referred to as substrate 101). The semiconductor substrate 101 may include a semiconductor material, such as silicon, doped or undoped, or an active layer of a semiconductor-on-insulator (SOI) substrate. The semiconductor substrate 101 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP. AlInAs, AlGaAs, GaInAs, GaInP, and/or GaInAsP; or combinations thereof. Other substrates, such as multi-layered or gradient substrates, may also be used.

In the example of FIG. 1, integrated circuit devices 103 are formed on or in the semiconductor substrate 101. Example integrated circuit devices 103 include transistors (e.g., Complementary Metal-Oxide Semiconductor (CMOS) transistors), resistors, capacitors, diodes, and the like. The integrated circuit devices 103 may be formed using any suitable method, details are not discussed here.

After the integrated circuit devices 103 are formed, an Inter-Layer Dielectric (ILD) layer 107 is formed over the semiconductor substrate 101 and over the integrated circuit devices 103. The ILD layer 107 may fill spaces between gate stacks of the transistors (not shown) of the integrated circuit devices 103. In accordance with some embodiments, the ILD layer 107 comprises silicon oxide, phosphosilicate glass (PSG), borosilicate glass (BSG), boron-doped phosphosilicate glass (BPSG), fluorine-doped silicate glass (FSG), tetraethyl orthosilicate (TEOS), or the like. The ILD layer 107 may be formed using spin coating, Flowable Chemical Vapor Deposition (FCVD), Plasma Enhanced Chemical Vapor Deposition (PECVD), Low Pressure Chemical Vapor Deposition (LPCVD), or the like.

Still referring to FIG. 1, contact plugs 105 are formed in the ILD layer 107, which contact plugs 105 electrically couple the integrated circuit devices 103 to overlying conductive features such as metal lines, vias, and conductive pillars. Note that in the present disclosure, unless otherwise specified, conductive features refer to electrically conductive features. In accordance with some embodiments, the contact plugs 105 are formed of a conductive material such as tungsten, aluminum, copper, titanium, tantalum, titanium nitride, tantalum nitride, alloys thereof, and/or multi-layers thereof. The formation of the contact plugs 105 may include forming contact openings in the ILD layer 107, forming one or more conductive material(s) in the contact openings, and performing a planarization process, such as a Chemical Mechanical Polish (CMP), to level the top surface of the contact plugs 105 with the top surface of the ILD layer 107.

Next, a plurality of Inter-Metal Dielectric (IMD) layers, such as 109 and 111, are formed over the ILD layer 107. The IMD layers 109 and 111 may be formed of a dielectric material such as silicon oxide, silicon nitride, silicon carbide, silicon oxynitride, or the like. In accordance with some embodiments, the IMD layers 109 and 111 are formed of a low-k dielectric material having a dielectric constant (k-value) lower than 3.0, such as about 2.5, about 2.0, or even lower. The IMD layers 109 and 111 may comprise Black Diamond (a registered trademark of Applied Materials), a carbon-containing low-k dielectric material, Hydrogen SilsesQuioxane (HSQ). MethylSilsesQuioxane (MSQ), or the like. The formation of each of the IMD layers 109 and 111 may include depositing a porogen-containing dielectric material over the ILD layer 107, and then performing a curing process to drive out the porogen, thereby forming the IMD layer that is porous, as an example. Other suitable method may also be used to form the IMD layers 109 and 111. In an example embodiment, the IMD layers 109 and 111 are formed of SiCO using a Chemical Vapor Deposition (CVD) process, where each of the IMD layers 109 and 111 (e.g., SiCO) has a thickness between about 200 angstroms and about 600 angstroms, and has a k-value between about 2.8 and about 3.5. A concentration of oxygen in the IMD layers 109 and 111 may be between about 40 atomic percentage (at %) and about 55 at %, a concentration of carbon in the IMD layers 109 and 111 may be between about 5 at % and about 20 at %, and a concentration of silicon in the IMD layers 109 and 111 may be between about 39 at % and about 40 at %.

As illustrated in FIG. 1, conductive features 112 (e.g., metal lines) are formed in the IMD layer 111. In the illustrated example, the conductive features 112 are metal lines that include a diffusion barrier layer 113 (may also be referred to as a barrier layer) and a conductive material 115 (e.g., copper, or a copper-containing material) over the diffusion barrier layer 113. The diffusion barrier layer 113 may include titanium, titanium nitride, tantalum, tantalum nitride, or the like, and may be formed by CVD. Physical Vapor Deposition (PVD), Atomic Layer Deposition (ALD), or the like. After the diffusion barrier layer 113 is formed, the conductive material 115 is formed over the diffusion barrier layer 113. The formation of the conductive features 112 may include a single damascene process, although other suitable formation method may also be used. The conductive feature 112 may also be referred to as a conductive line 112 or a metal line 112 hereinafter, with the understanding that the conductive feature 112 may be or include other features, such as a via, or a conductive line with an underlying via connected to the conductive line. Although FIG. 1 illustrates one or more IMD layers 109 formed between the IMD layer 111 and the ILD layer 107, this is merely a non-limiting example. One skilled in the art will readily appreciate that the IMD layer 111 may be formed directly on (e.g., physically contacts) the ILD layer 107. In addition, although not illustrated in FIG. 1, conductive features, such as conductive lines and/or vias, are formed in the IMD layers 109 to electrically couple the conductive lines 112 with the integrated circuit devices 103.

Next, a metal cap layer 116 is formed (e.g., selectively formed) on the upper surfaces of the conductive lines 112. The portion of metal cap layer 116 on each conductive line 112 is also referred to as a metal cap 116 for the underlying conductive line 112. In some embodiments, the metal cap layer 116 is formed of an electrically conductive material, such as a metal or a metal-containing material. In accordance with some embodiments of the present disclosure, the metal cap layer 116 is formed of cobalt (Co), CoWP, CoB, tungsten (W), tantalum (Ta), nickel (Ni), molybdenum (Mo), titanium (Ti), iron (Fe), combinations thereof, and/or alloys thereof. A suitable formation method, such as PVD, CVD, PECVD, ALD, or the like, may be used to form the metal cap layer 116. A thickness of the metal cap layer 116 may be between about 20 angstroms and about 40 angstroms, as an example.

In the example of FIG. 1, the metal cap 116 on each conductive line 112 has a same width as the conductive line 112, such that sidewalls of the metal cap 116 are aligned (e.g., vertically aligned) with respective sidewalls of the barrier layer 113 of the conductive line 112. In other embodiments, the metal cap 116 on each conductive line 112 has a same width as the conductive material 115 of the conductive line 112, such that sidewalls of the metal cap 116 are aligned (e.g., vertically aligned) with respective sidewalls of the conductive material 115.

In some embodiments, the metal cap layer 116 is formed of a selective deposition process that has a first deposition rate on the conductive line 112 and has a second deposition rate on the IMD layer 111, where the first deposition rate is higher than the second deposition rate. An etching process is performed after the selective deposition process to remove the metal cap layer 116 from the upper surfaces of the IMD layer 111. In another embodiment, the metal cap layer 116 is blanket deposited over the conductive lines 112 and the IMD layer 111. Next, a pattern mask layer (e.g., a patterned photoresist layer) is formed over the metal cap layer 116, where portions of the metal cap layer 116 over (e.g., directly over) the conductive lines 112 are covered by the patterned mask layer, and portions of the metal cap layer 116 over (e.g., directly over) the IMD layer 111 are exposed by patterns (e.g. openings) of the patterned mask layer. An etching process is then performed to remove the portions of the metal cap layer 116 exposed by the patterns of the patterned mask layer. After the etching process, the patterned mask layer is removed by a suitable process, such as ashing.

Figure 2:
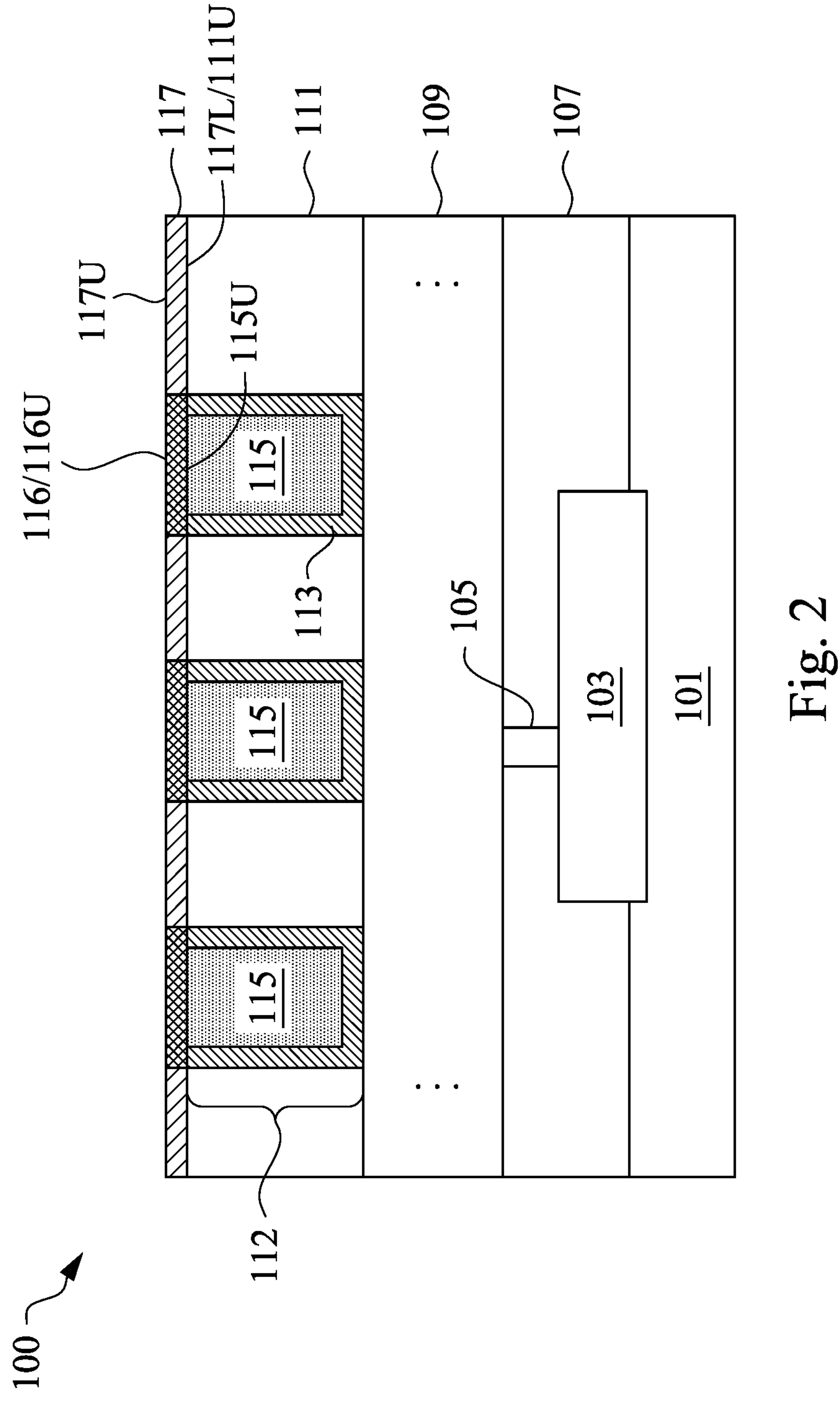

Referring now to FIG. 2, a dielectric cap layer 117 is formed (e.g., selectively formed) on the upper surface of the IMD layer 111. In some embodiments, the dielectric cap layer 117 is a nitride-containing dielectric material, such as $SiN_x$, $SiON_x$, or $SiCN_x$, where x may be 1 or 2. A thickness of the dielectric cap layer 117 may be between about 5 angstroms and about 50 angstroms, or between about 10 angstroms and about 50 angstroms. A density of the dielectric cap layer 117 may be between about 1.5 $g/cm^3$ and about 3.2 $g/cm^3$.

In the example of FIG. 2, the dielectric cap layer 117 is formed by a suitable deposition process such as PECVD. In some embodiments, the PECVD process is performed using a nitrogen-containing gas source, such as $N_2$, $NH_3$, NO, or $N_2O$. A carrier gas, such as Ar, $N_2$, $O_3$, or a mixture of He and $O_2$, is used to carry the nitrogen-containing gas source into a processing chamber for the PECVD process. After the dielectric cap layer 117 is formed, a concentration of nitride in the dielectric cap layer 117 is between about 2 at % and about 10 at %, in some embodiments. Besides the PECVD process, other methods for forming the dielectric cap layer 117 are also possible and are fully intended to be included within the scope of the present disclosure. For example, an embodiment where the dielectric cap layer 117 is formed by an ion implantation process is discussed hereinafter with reference to FIGS. 8-10.

In some embodiments, during the PECVD process to form the dielectric cap layer 117, the material of the dielectric cap layer 117 is formed on the IMD layer 111 at a first deposition rate, and is formed on the metal cap layer 116 at a second deposition rate, where the first deposition rate is higher than the second deposition rate. After the PECVD process, an etching process may be performed to remove the material of the dielectric cap layer 117 from the upper surface of the metal cap layer 116, and the remaining portions of the material of the dielectric cap layer 117 on the upper surface of the IMD layer 111 form the dielectric cap layer 117.

In the example of FIG. 2, the dielectric cap layer 117 is laterally adjacent to the metal cap layer 116. A lower surface 117L of the dielectric cap layer 117 physically contacts an upper surface 111U of the IMD layer 111, and is level with an upper surface 115U of the conductive material 115 (or an upper surface of the barrier layer 113) distal from the substrate 101. An upper surface 117U of the dielectric cap layer 117 is level with an upper surface 116U of the metal cap layer 116, in the illustrated example. In another embodiment, the upper surface 117U is lower than the upper surface 116U of the metal cap layer 116, e.g., vertically between the upper surface 116U of the metal cap layer and the upper surface 111U of the IMD layer 111. In yet another embodiment, the upper surface 117U of the dielectric cap layer 117 is higher (extends further from the substrate 101) than the upper surface 116U of the metal cap layer, e.g., by less than about 50 angstroms. As illustrated in FIG. 2, the dielectric cap layer 117 covers the upper surface 111U of the IMD layer 111, and extends continuously along the upper surface 111U of the IMD layer 111 from a conductive line 112 to an adjacent conductive line 112.

In some embodiments, by forming the dielectric cap layer 117 between adjacent conductive lines 112, leakage current paths between adjacent conductive lines 112 at the interface between the IMD layer 111 and an overlying dielectric layer (see e.g., 127 in FIG. 4) are reduced or prevented, which improves the device performance and reduces power consumption. In addition, the Time-Dependent Dielectric Breakdown (TDDB) performance of the device formed is also improved, compared with a reference design without the dielectric cap layer 117.

Figure 3:
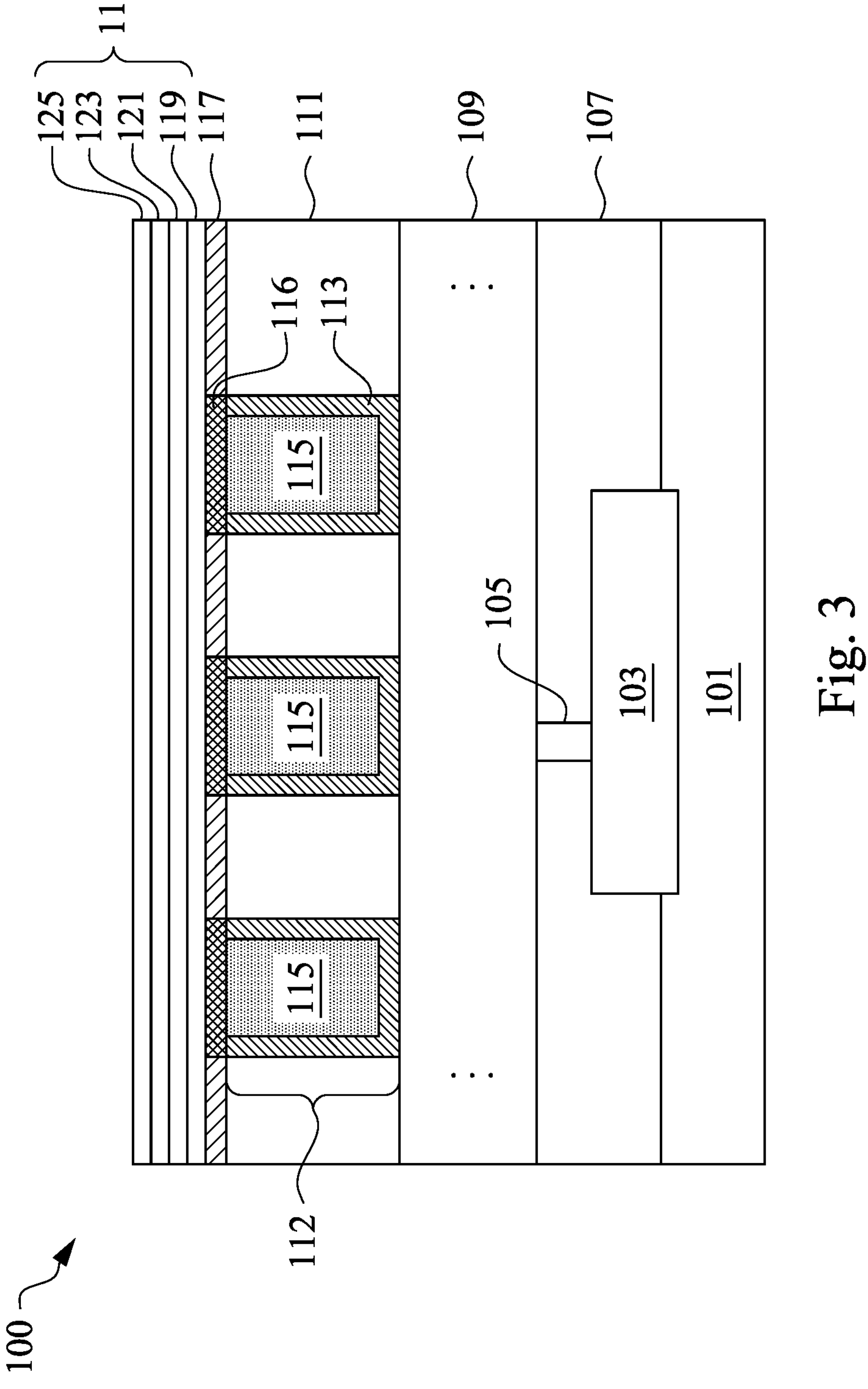

Next, in FIG. 3, an etch stop layer stack 118 is formed over the dielectric cap layer 117 and over the metal cap layer 116. In the example of FIG. 3, the etch stop layer stack 118 includes a plurality of Etch Stop Layers (ESLs) 119, 121, 123 and 125. Therefore, forming the etch stop layer stack 118 comprises forming the ESLs 119, 121, 123, and 125 successively over the dielectric cap layer 117 and over the metal cap layer 116.

In some embodiments, the ESL 119 is formed of a metal nitride that has good adhesion to the underlying metal cap layer 116 and the dielectric cap layer 117. For example, the ESL 119 may be formed of aluminum nitride (AlN), aluminum oxynitride (AlNO), manganese nitride ($Mn_3N_2$), gallium nitride (GaN), Aluminum gallium nitride (AlGaN), or the like. In the discussion herein, the ESL 119 may be alternatively referred to as an aluminum nitride layer 119, with the understanding that the ESL 119 may be formed of other suitable materials besides aluminum nitride, such as those listed above.

In accordance with some embodiments, the ESL 119 is formed using a suitable formation method, such as PVD, CVD, ALD, or the like. The precursors for forming the ESL 119 may include a nitrogen-containing process gas such as $NH_3$ and an aluminum-containing process gas such as Trimethyl Aluminum (TMA) ($Al_2$ $(CH_3)_6$) or the like. In an example deposition process (e.g., an ALD process), the nitrogen-containing process gas and the aluminum-containing process gas are alternatively supplied to the process chamber and then purged to grow aluminum nitride atomic layers in each cycle of the deposition process.

In accordance with some embodiments, the thickness of the ESL 119 is in a range between about 5 angstroms and about 30 angstroms. The thickness of the ESL 119 should be within a suitable range. If the ESL 119 is too thick (e.g., thicker than about 30 angstroms), when etching-through the ESL 119 in subsequent processes, undercuts may be generated. If the ESL 119 is too thin (e.g., thinner than about 5 angstroms), the ESL 119 may not effectively stop the etching of the overlying layers.

The temperature of the semiconductor device 100 during the deposition of the aluminum nitride layer 119 is controlled to be within a suitable range, such as between about 300° C. and 380° C. It is appreciated that the temperature of semiconductor device 100 affects the deposition rate. If the temperature is too low (e.g., lower than about 300° C.), the deposition rate may be too low to be economically feasible for semiconductor manufacturing, due to the long time needed to form the aluminum nitride layer 119. If the temperature is too high (e.g., higher than about 380° C.), the resulting aluminum nitride layer 119 is crystalline (e.g., polycrystalline), which may results in increased copper diffusion from the conductive line 112 to overlying layers. Therefore, the temperature of semiconductor device 100 during the deposition of aluminum nitride layer 119 is selected to be in a range between about 300° C. and about 380° C. to avoid the aforementioned issues, in some embodiments.

The as-deposited aluminum nitride layer 119 may (or may not) include some crystalline structures such as polycrystalline structures, which include grains therein. Some grains may be connected to each other, while some other grains may be buried in amorphous structures. The copper in the conductive line 112 may diffuse upward along the grain boundaries to overlying layers that will be formed subsequently. Therefore, to reduce the upward diffusion of copper, after the deposition of the aluminum nitride layer 119, a treatment process (also referred to as an amorphization process) is performed to convert the polycrystalline structures (if any) in the aluminum nitride layer 119 into amorphous structures, so that the entire aluminum nitride layer 119 is amorphous. Since amorphous aluminum nitride layer 119 does not have grain boundaries, it has better ability to prevent copper from diffusing through.

In accordance with some embodiments of the present disclosure, the treatment process (e.g., a plasma process) for the as-deposited aluminum nitride layer 119 is performed using a process gas comprising $NH_3$, $N_2$, or combination thereof. Other gases, such as argon, may also be added. In the treatment process, the aluminum nitride layer 119 is bombarded. The bombardment destroys the crystalline structures. In addition, with hydrogen and nitrogen atoms being in the process gas (e.g., $NH_3$), hydrogen and nitrogen may be added into the aluminum nitride layer 119. Accordingly, the aluminum nitride layer 119 may comprise hydrogen doped therein as a result of the treatment process. In accordance with some embodiments, after the amorphization process, the aluminum nitride layer 119 has a hydrogen atomic percentage in the range between about 1 at % and about 3 at %.

The treatment process also has the effect of changing the aluminum-to-nitrogen atomic ratio (referred to as Al:N atomic ratio hereinafter), which also affects whether the resulting aluminum nitride layer 119 has crystalline or amorphous structures. For example, an un-processed crystalline aluminum nitride layer may have an atomic ratio Al:N close to 1:1. The addition of nitrogen atoms by the amorphization process changes this ratio. For example, with nitrogen being used for the bombardment, nitrogen atoms bond with aluminum atoms, so that one aluminum atom may be cross-linked with more than one nitrogen atoms (which may further bond with hydrogen atoms). It is thus easier for amorphous structures to be formed. Furthermore, with one aluminum atom being bonded to more than one nitrogen atoms, the re-crystallization of aluminum nitride layer 119 is prevented even if the temperature in subsequent processes is high enough for recrystallization. In addition, since the added nitrogen atoms may further be bonded with hydrogen atoms, hydrogen is also added into the aluminum nitride layer 119 by the treatment process.

In accordance with some embodiments of the present disclosure, during the treatment process, the $NH_3$ gas (when used) has a flow rate in the range between about 50 sccm and about 500 sccm. The $N_2$ gas (when used) has a flow rate in the range between about 1,000 sccm and about 3,000 sccm. The temperature of the semiconductor device 100 during the treatment process may be in the range between about 340° C. and about 400° C.

In accordance with some embodiments, the treatment process is or comprises a plasma treatment, which may be a direct plasma process, with the plasma being generated in the same process chamber where the semiconductor device 100 is treated. The plasma treatment process is performed using both a High-Frequency Radio-Frequency (HFRF) power (e.g., with a frequency about 13.56 MHZ) and a Low-Frequency Radio-Frequency (LFRF) power (e.g., with a frequency of about 350 KHz). The HFRF power is used for ionization and to generate plasma, and the LFRF power is used for bombarding the aluminum nitride layer 119 for amorphization purpose. In accordance with some embodiments of the present disclosure, the HFRF power is in the range between about 400 watts and about 800 watts.

The LFRF power is selected to be in a suitable range. If the LFRF power is too low (e.g., lower than about 90 watts), nitrogen ions may not be effectively doped into the aluminum nitride layer 119. If the LFRF power is too high (e.g., higher than about 135 watts), there may be severe plasma-induced damage to layer/structures underlying the aluminum nitride layer 119. In accordance with some embodiments of the present disclosure, the LFRF power is selected to be in the range between about 90 watts and about 135 watts to avoid the aforementioned issues.

In some embodiments, after the treatment process, the aluminum nitride layer 119 has an aluminum atomic percentage in a range between about 55 at % and about 63 at %, a nitride atomic percentage in a range between about 37 at % and about 43 at %, and a carbon atomic percentage in a range between about 0.5 at % and about 2 at %. In some embodiments, when the atomic percentages of the different materials (e.g., aluminum, nitride, carbon) of the aluminum nitride layer 119 are within the above described ranges, the physical properties of the aluminum nitride layer 119 can meet the etch-selective capability of the etch stop layer stack 118, where the etch-selective capability of the etch stop layer stack 118 means that during the subsequently etching processes to form trench openings 131T and via openings 131V (see, e.g., FIG. 5), the etching processes can maintain anisotropicity along the desired etching direction (e.g., vertically) in the etch stop layer stack 118.

Still refer to FIG. 3, the ESL 121 is formed on the ESL 119. The ESL 121 is formed of aluminum oxide ($AlO_x$, with x being the atomic ratio of oxygen-to-aluminum), in an example embodiment. The ESL 121 may also be formed of other materials that have a high etching selectivity relative to the underlying ESL 119 and the overlying ESL 123. The formation methods for the ESL 121 include ALD, CVD, PECVD, or the like. In accordance with some embodiments of the present disclosure, the ESL 121 is formed using precursors comprising a metal-containing precursor such as TMA and an oxygen-containing precursor such as $H_2O$, $O_3$, or the like. A thickness of the ESL 121 may be in the range between about 10 angstroms and about 50 angstroms. In some embodiments, the thickness of the aluminum nitride layer 119 and the ESL 121 are determined by, e.g., the etch-selective capability of the etch stop layer stack 118 and/or the reliability window of the device formed.

In some embodiments, after being formed, the ESL 121 has an aluminum atomic percentage in a range between about 40 at % and about 45 at %, an oxygen atomic percentage in a range between about 55 at % and about 60 at %, and a carbon atomic percentage in a range between about 0.5 at % and about 1 at %. In some embodiments, when the atomic percentages of the different materials (e.g., aluminum, oxygen, carbon) of the ESL 121 are within the above described ranges, the physical properties of the ESL 121 can meet the etch-selective capability of the etch stop layer stack 118.

The ESL 121 improves the etch selectivity of the etch stop layer stack 118, and helps to further reduce the leakage current between conductive lines 112, in some embodiments. In addition, the process to form the aluminum nitride layer 119 and the ESL 121 may enhance the adhesion between the metal cap layer 116 and the conductive material 115 (e.g., copper), thus reducing or avoiding copper metal diffusion induced issues, such as copper pits formed on copper metal lines or copper metal line open.

Next, the ESL 123 is formed on the ESL 121. In an example embodiment, the ESL 123 is formed of oxygen-doped (silicon) carbide (ODC), which is also known as silicon oxy carbide (SiOC). The ESL 123 may also be formed of another material such as Nitrogen-Doped silicon Carbide (NDC), SiC, or the like. The deposition method for the ESL 123 may be CVD or another suitable method such as ALD, PECVD, High-Density Plasma CVD (HDPCVD), or the like. A thickness of the ESL 123 may be in the range between about 20 angstroms and about 100 angstroms.

In some embodiments, the precursors for forming the ESL 123 depend on the desired composition of the ESL 123, and may include silicon (Si), carbon (C), hydrogen (H), nitrogen (N), oxygen (O), boron (B), and/or the like. In accordance with some embodiments, the precursors include a gas selected from 1-methylsilane ($Si(CH)H_3$, also known as 1 MS), 2-methylsilane ($Si(CH)_2H_2$, also known as 2 MS), 3-methylsilane ($Si(CH)_3H$, also known as 3 MS), 4-methylsilane ($Si(CH)_4$, also known as 4 MS), or combinations thereof. An inert gas such as He, $N_2$. Ar. Xe, or the like may be used as ambient gas. If ODC is to be formed, carbon dioxide ($CO_2$) may also be added to provide oxygen. If NDC is to be formed, $NH_3$ may be added to provide nitrogen. Further, the precursors may include boron-containing gases such as $B_2H_6$, $BH_3$, or combinations thereof to provide boron in the resulting ESL 123.

In addition to the above-discussed precursors, one or more carbon-source gas may be added to increase the carbon content in the resulting ESL 123. The carbon-source gas may be a carbon-rich source, which means that the atomic percentage of carbon in the carbon-source gas is high, for example, greater than about 10 at %, or greater than about 20 at %, or 30 at %. In an example embodiment, the carbon-source gas is a carbon-hydrogen containing gas selected from $C_2H_4$, $C_2H_6$, and combinations thereof. With the additional carbon provided by the carbon-source gas, the carbon percentage in the resulting ESL 123 is increased, and the property of the ESL 123 is improved. In accordance with some embodiments, the ratio of the flow rate of the carbon source gas to the flow rate of all 1 Ms/2 Ms/3 Ms/4 Ms gases is greater than about 2 to 4.

In accordance with some embodiments, the formation of ESL 123 is performed in a chamber using, for example, PECVD, where the temperature of semiconductor device 100 may be between about 300° C. and about 500° C., and the chamber pressure may be between about 2 torr and about 10 torr. The power source for forming the ESL 123 may include an HFRF power and a LFRF power. In the formation of the ESL 123, the HFRF power source may provide a power between about 100 watts and about 1,000 watts, while the LFRF power source may provide a power lower than about 135 watts, and may be as low as zero watts (meaning no low-frequency power is provided). The high-frequency RF power and the LFRF power may be provided simultaneously.

In some embodiments, after being formed, the ESL 123 has an oxygen atomic percentage in a range between about 40 at % and about 50 at %, a silicon atomic percentage in a range between about 36 at % and about 40 at %, and a carbon atomic percentage in a range between about 15 at % and about 20 at %. In some embodiments, when the atomic percentages of the different materials (e.g., oxygen, silicon, carbon) of the ESL 123 are within the above described ranges, the physical properties of the ESL 123 can meet the etch-selective capability of the etch stop layer stack 118.

Next, the ESL 125 is formed over the ESL 123. In an example embodiment, the ESL 125 is formed of a same material as the ESL 121, such as aluminum oxide. The formation method, dimension (e.g., thickness), and material composition (e.g., atomic percentage of various elements) of the ESL 125 may be the same as or similar to those of the ESL 121, thus not repeated. In an example embodiment, the ESL 119 is formed of aluminum nitride, the ESL 121 is formed of aluminum oxide, the ESL 123 is formed of ODC, and the ESL 125 is formed of aluminum oxide.

Each of the ESLs 121, 123, and 125 may have a polycrystalline structure or an amorphous structure, which may be achieved by adjusting the deposition temperature. Since the diffusion of copper atoms is blocked by the underlying ESL 119, whether the ESLs 121, 123, and 125 are polycrystalline or amorphous does not affect the upward diffusion of copper atoms.

In the example of FIG. 3, the etch stop layer stack 118 includes four ESLs (119, 121, 123, and 125). In accordance with alternative embodiments of the present disclosure, the etch stop layer stack 118 includes three ESLs (see FIGS. 11 and 12), such as the ESLs 119, 123, and 125. Details of the alternative embodiments are discussed hereinafter with reference to FIGS. 11 and 12.

Figure 4:
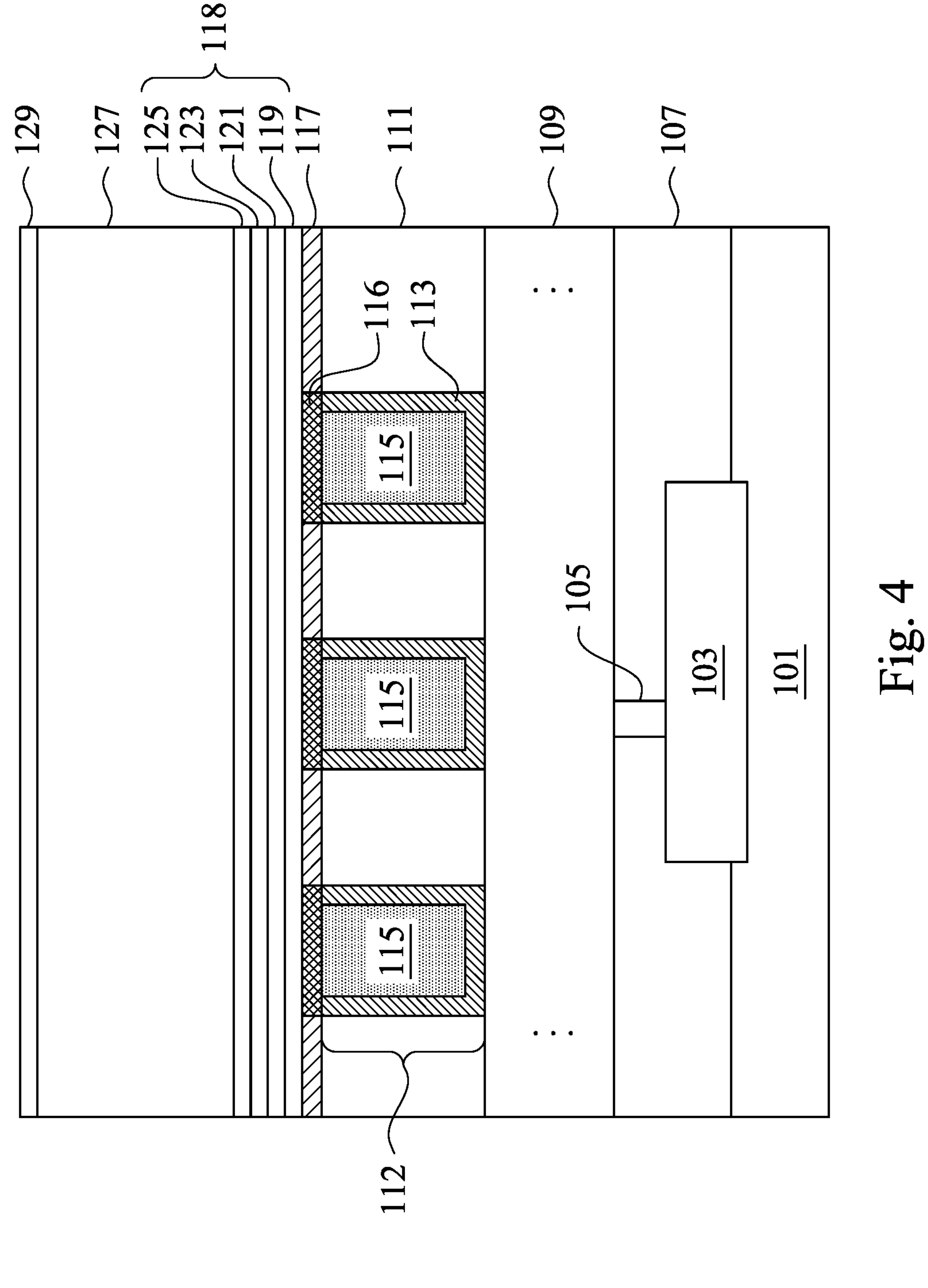

Next, referring to FIG. 4, an IMD layer 127 is formed over the etch stop layer stack 118. The IMD layer 127 may be formed by a same or similar formation process using same or similar material(s) as the IMD layer 111, thus details are not repeated.

Next, a mask layer 129 is formed over the IMD layer 127. In subsequent processing, a pattern is transferred onto the mask layer 129 using, e.g., photolithography and etching techniques. The mask layer 129 may then be used as a patterning mask for etching the underlying IMD layer 127.

The mask layer 129 may be formed of a masking material such as silicon nitride, titanium nitride, titanium oxide, the like, or a combination thereof, using a process such as CVD, PVD, ALD, the like, or a combination thereof.

Figure 5:
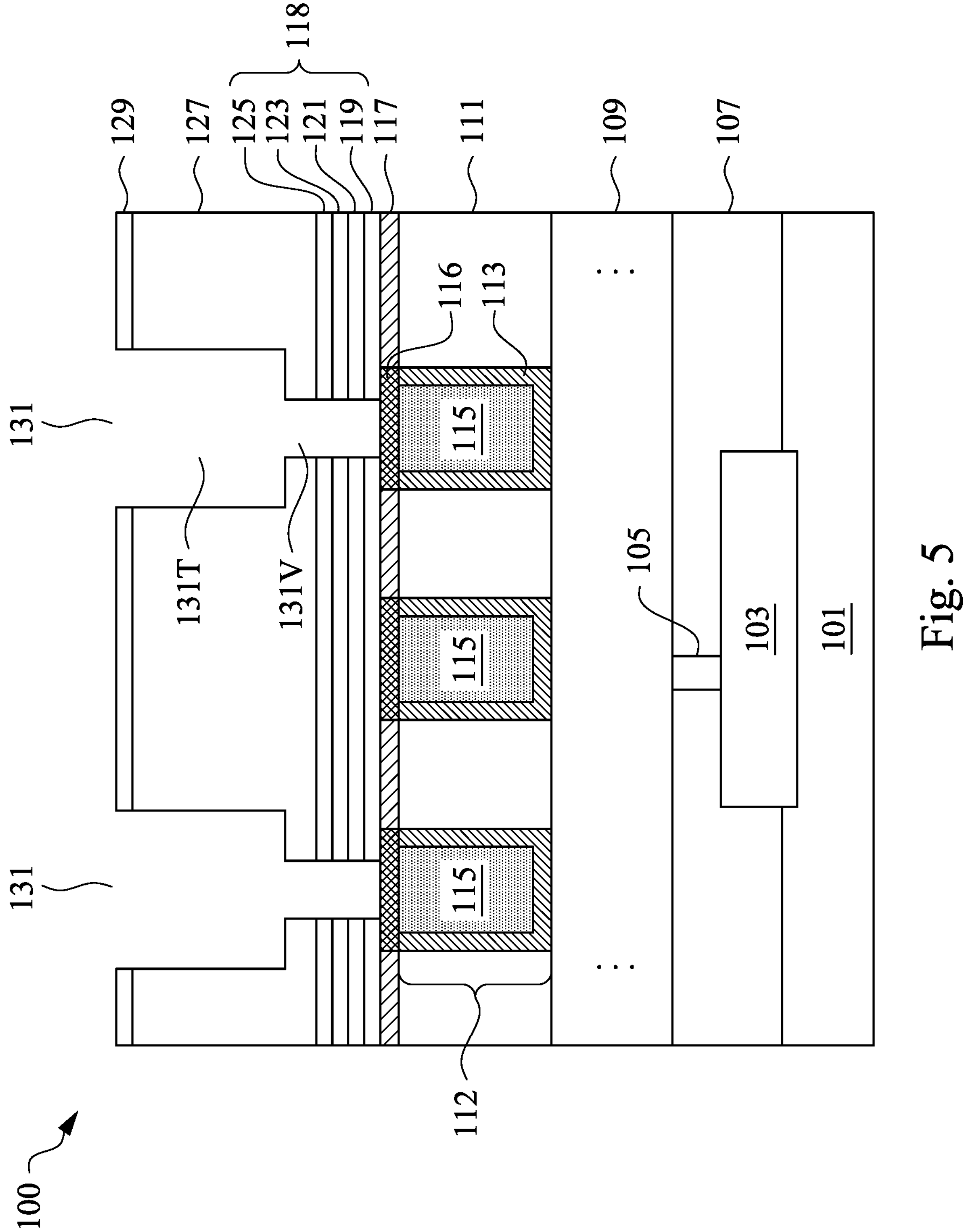

Next, in FIG. 5, the mask layer 129 is patterned, and the patterns of the mask layer 129 are transferred to the IMD layer 127, e.g., through one or more etching processes to form openings 131. In the example of FIG. 5, each of the openings 131 includes a via opening 131V and a trench opening 131T overlying the via opening 131V. In an embodiment, to form the via openings 131V and the trench openings 131T, a first etching process (e.g., an anisotropic etching process) is performed, using the patterned mask layer 129 as the etching mask, to form the trench openings 131T by etching into the IMD layer 127 from the upper surface of the IMD layer 127. The first etching process is stopped once the depth of the openings 131 reaches the target depth of the trench openings 131T. Next, a second mask layer (not illustrated), such as a photoresist layer, is formed to fill the openings 131 and is formed over the upper surface of the mask layer 129. The second mask layer is then patterned, where patterns (openings) of the second mask layer correspond to locations of the via openings 131V. Next, a second etching process (e.g., an anisotropic etching process) is performed, using the patterned second mask layer as the etching mask, to form the via openings 131V. Note that the second etching process may stop at the ESL 125 (e.g., when the ESL 125 is exposed). Additional etching steps, as described below in detail, are performed to extend the via openings 131V through the etch stop layer stack 118 and to expose the metal cap layer 116. Besides the method described above, other methods for forming the via openings 131V and the trench openings 131T are also possible and are fully intended to be included within the scope of the present disclosure.

In accordance with some embodiments of the present disclosure, the etching of the IMD layer 127 is performed using a process gas comprising fluorine and carbon, wherein fluorine is used for etching, and carbon is used to generate plasma that may protect the sidewalls of the resulting via opening 131V and trench openings 131T. With an appropriate fluorine and carbon ratio, the via opening 131V and the trench openings 131T may have desirable profiles (e.g., sidewall profiles). For example, the process gases for the etching include a fluorine-and-carbon containing gas(es) such as $C_4F_8$ and/or $CF_4$, and a carrier gas such as $N_2$.

In the illustrated embodiment, the etching of the IMD layer 127 stops at the ESL 125. Next, the ESL 125 (e.g., $AlO_x$) is etched, e.g., through a dry etching process followed by a wet etching process. In some embodiments, the dry etching process is performed using etching gases such as a mixture of $BCl_3$ and $Cl_2$. The wet etching may be performed using, e.g., phosphoric acid. Next, the ESL 123 (e.g., ODC) is etched, e.g., using an etching gas including a fluorine-and-carbon containing gas such as $CF_4$ and other gas(es) such as argon. Next, the ESL 121 (e.g., $AlO_x$) is etched. In the illustrated embodiment, the ESL 121 and the ESL 125 are formed of a same material (e.g., $AlO_x$), and therefore, the same etching process(es) for etching the ESL 125 may be performed again to etch the ESL 121. Next, the ESL 119 (e.g., AlN) is etched-through, e.g., using a mixture of $BCl_3$, $Cl_2$, and argon. The ESL 119 may also be etched by a wet etching process using, e.g., phosphoric acid. After the etching of the ESL 119, the metal cap layer 116 is exposed.

The formation of the amorphous ESL 119 (e.g., AlN) has the advantage of improving the aforementioned etching of the IMD layer 127 and the etch stop layer stack 118. The amorphous structure of ESL 119, which does not have grains and grain boundaries, may effectively block the copper atoms in the conductive lines 112 from diffusing upward into the etch stop layer stack 118 and the IMD layer 127. Otherwise, if the ESL 119 has polycrystalline structures, copper may diffuse along the grain boundaries into the etch stop layer stack 118 and the overlying IMD layer 127. The diffused copper may reduce the etching rates in the etching of the ESLs 119/121/123/125 and the IMD layer 127. The reduced etching rates may cause the etching for forming the via openings 131V to prematurely stopped inside the etch stop layer stack 118 or even inside the IMD layer 127, which effect is referred to as under-etching of the etch stop layer stack 118 and the IMD layer 127. As a result of the under-etching, the subsequently formed vias in the via openings 131V are not able to electrically connect to the conductive lines 112, thereby causing circuit failure. The amorphization process disclosed herein ensures that the ESL 119 has an amorphous structure to prevent copper diffusion, and therefore, avoids the under-etching issue. As a result, device reliability and production yield are improved.

Figure 6:
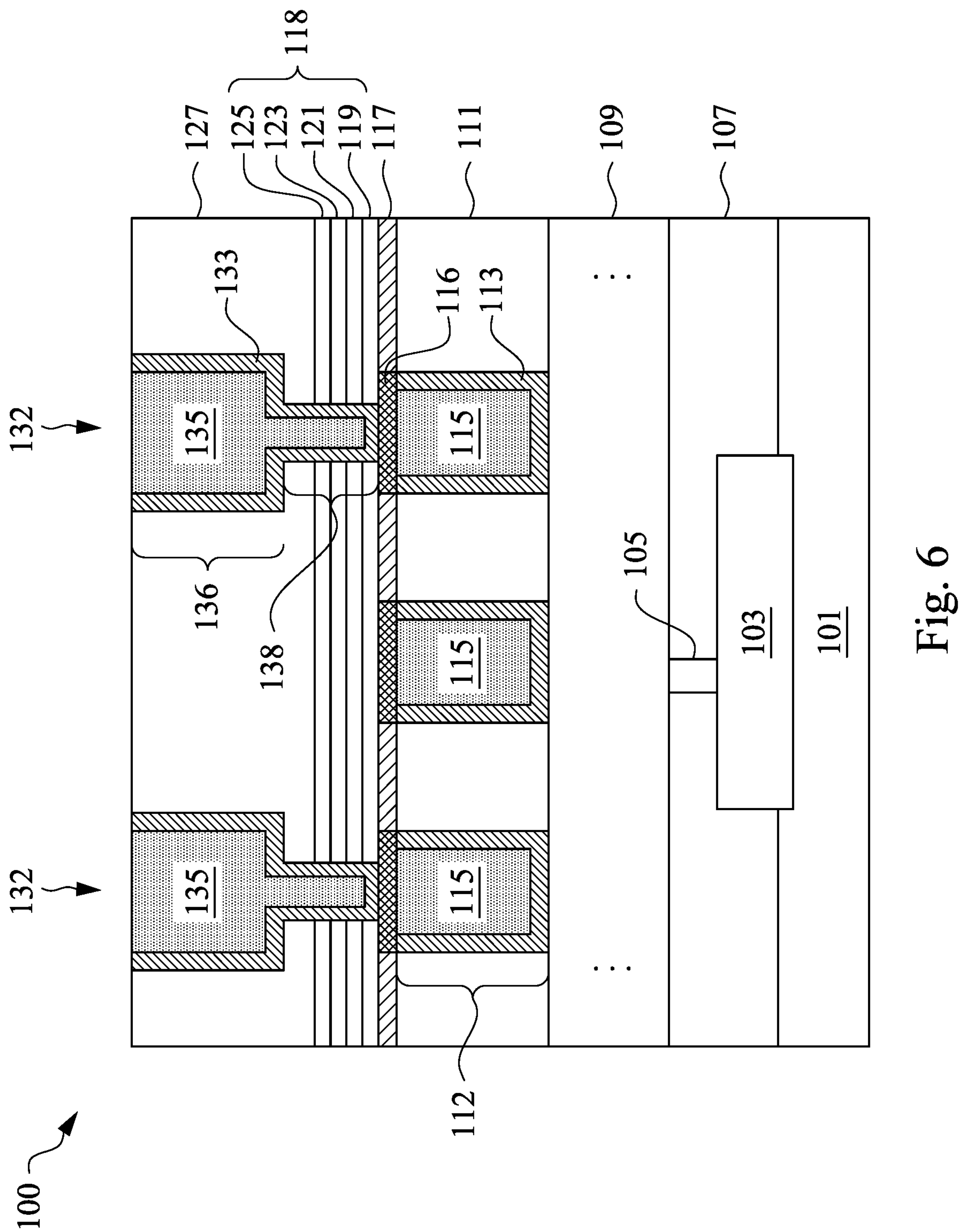

Next, in FIG. 6, conductive features 132 are formed in the openings 131. Each of the conductive features 132 includes a via 138 and a conductive line 136, in the illustrated example. Each of the vias 138 electrically couples an overlying conductive line 136 to an underlying conductive line 112.

In some embodiments, to form the conductive features 132, a barrier layer 133 is formed (e.g., conformally) to line sidewalls and bottoms of the openings 131. The barrier layer 133 may also be formed over the upper surface of the mask layer 129 (see FIG. 5). Next, a conductive material 135 is formed over the barrier layer 133 to fill the openings 131. The barrier layer 133 and the conductive material 135 may be the same as or similar to the barrier layer 113 and the conductive material 115, respectively, and may be formed using a same or similar formation method(s), thus details are not repeated.

After the barrier layer 133 and the conductive material 135 are formed, a planarization process, such as CMP, is performed to remove excess portions of the barrier layer 133 and the conductive material 135 from the upper surface of the IMD layer 127. The planarization process also removes the mask layer 129, in the illustrated embodiment. After the planarization process, remaining portions of the barrier layer 133 and the conductive material 135 in the via openings 131V form the vias 138, and remaining portions of the barrier layer 133 and the conductive material 135 in the trench openings 131T form the conductive lines 136.

Figure 7:
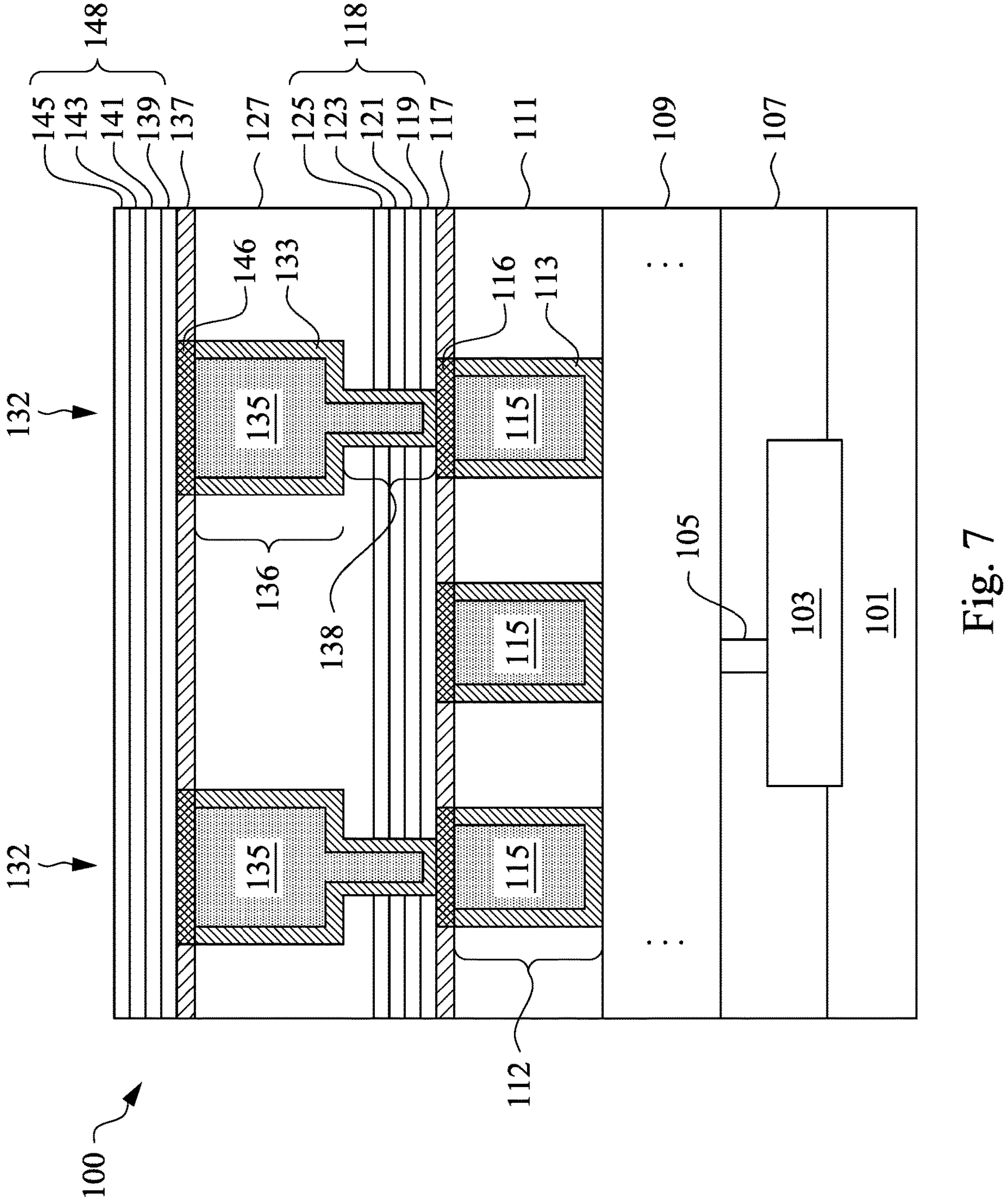

Next, in FIG. 7, a metal cap layer 146 is formed (e.g., selectively formed) over the upper surfaces of the conductive features 132. Next, a dielectric cap layer 137 is formed over the upper surface of the IMD layer 127, and thereafter, an etch stop layer stack 148, which includes ESLs 139, 141, 143, and 145, are formed on the metal cap layer 146 and the dielectric cap layer 137. The metal cap layer 146 and the dielectric cap layer 137 may be formed of a same or similar material(s) as the metal cap layer 116 and the dielectric cap layer 117, respectively, and may be formed using the same or similar formation method, thus details are not repeated. In addition, the ESLs 139, 141, 143, and 145 may be formed of a same or similar material(s) using the same or similar formation method as the ESLs 119, 121, 123, and 125, respectively, thus details are not repeated.

Additional processing may be performed to finish the manufacturing of the semiconductor device 100. For example, additional IMD layers and additional conductive features (e.g., vias, conductive lines) may be formed over the etch stop layer stack 148 to form interconnect structures that electrically connects the integrated circuit devices 103 to form functional circuits. In addition, under bump metallization (UBM) structures may be formed over the interconnect structures, and external connectors (e.g., copper pillars and/or solder balls) may be formed over the UBM structures to provide electrical connection to the functional circuits of the semiconductor device 100. Details are not discussed here.

Figure 8:
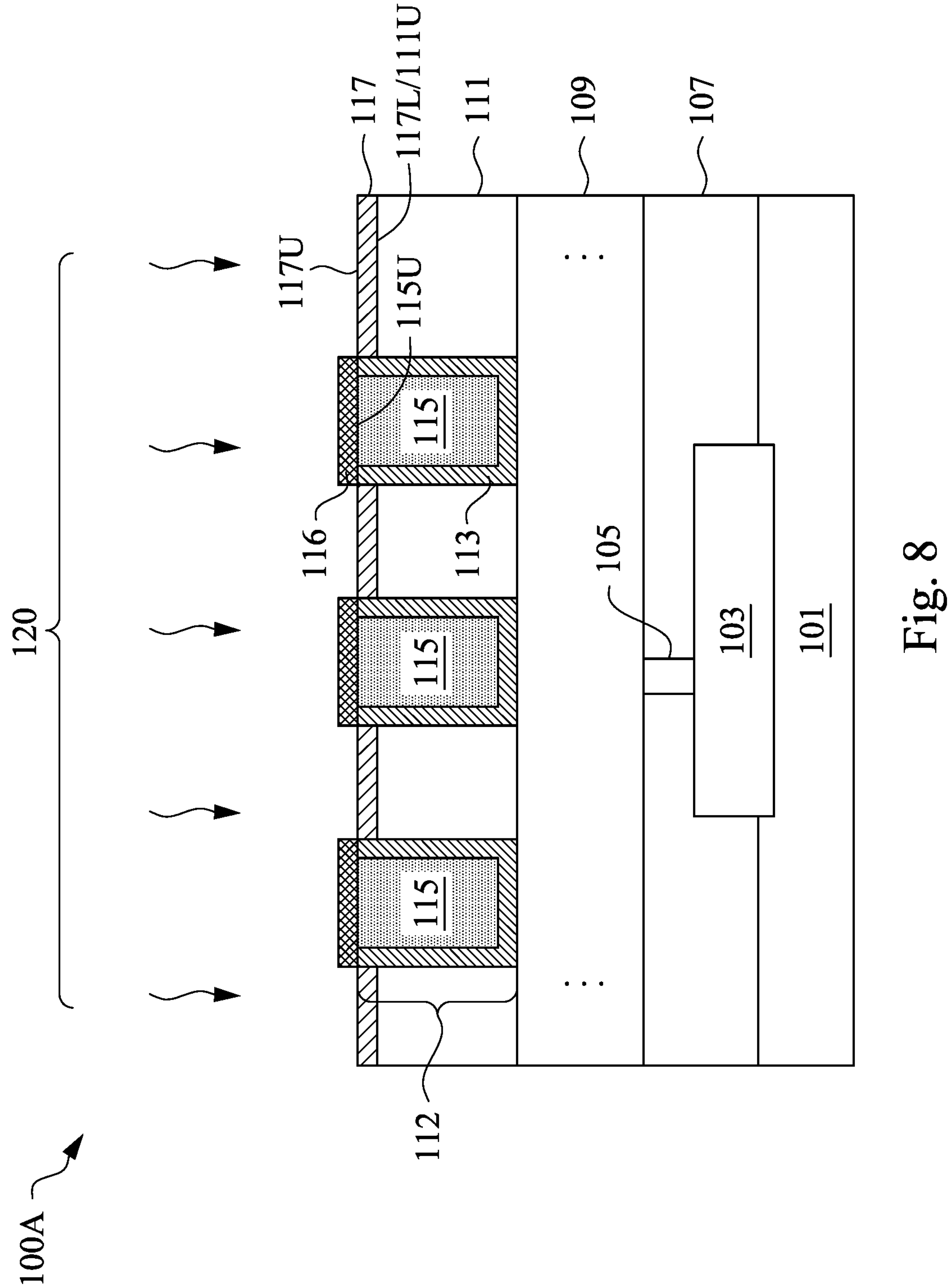
FIGS. 8 through 10 illustrate cross-sectional views of a semiconductor device at various stages of manufacturing, in accordance with another embodiment.
Figure 9:
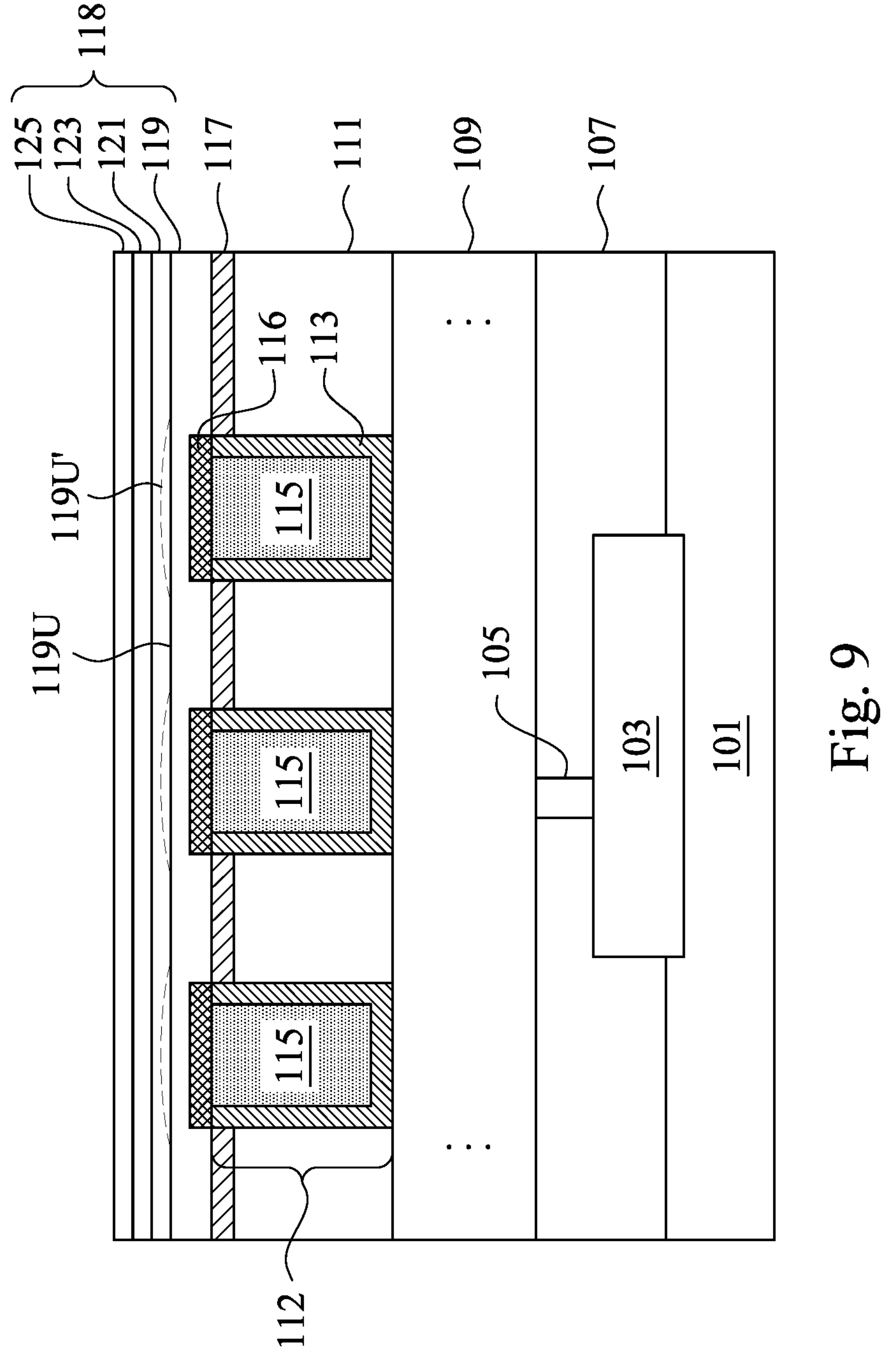
Figure 10:
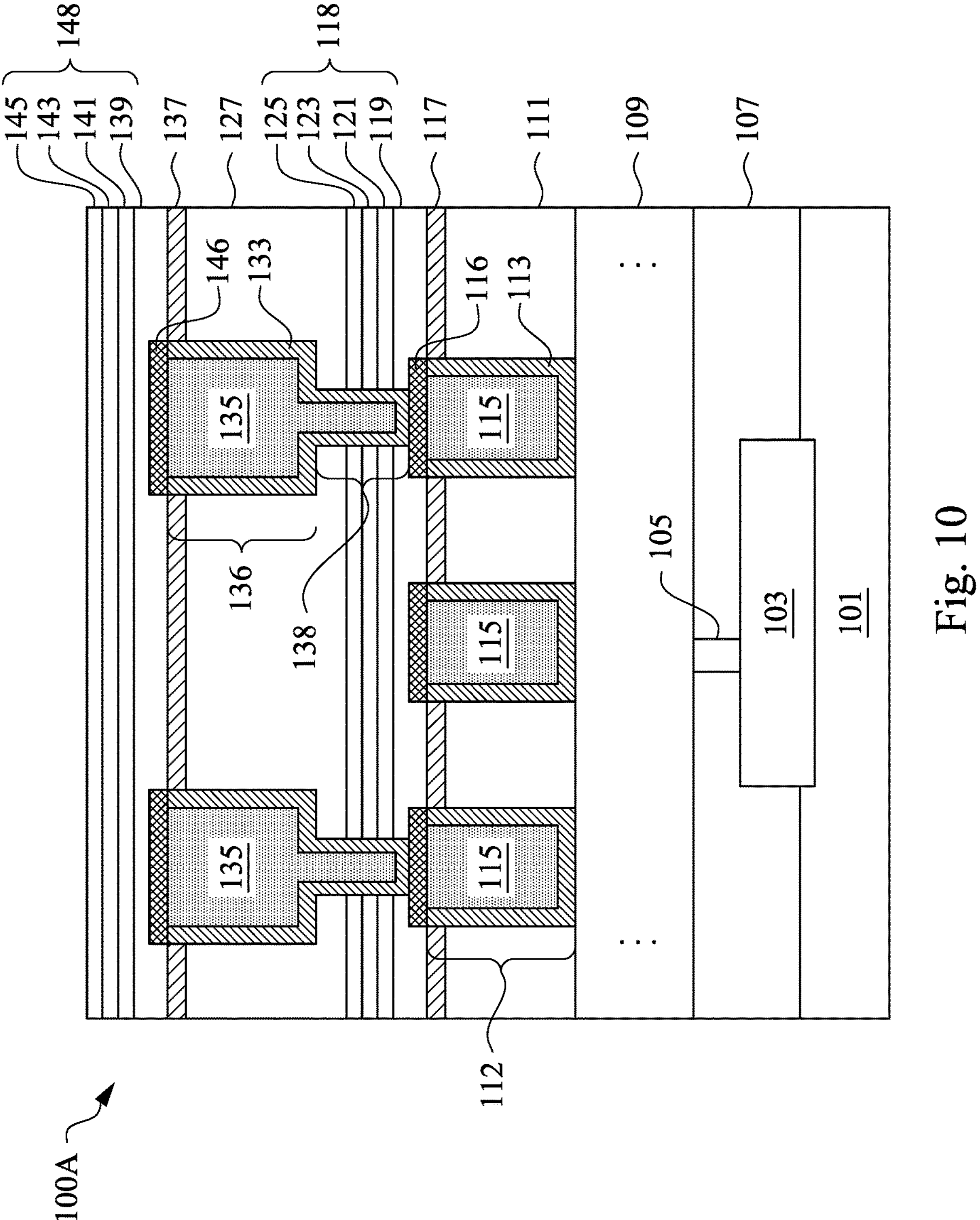

FIGS. 8 through 10 illustrate cross-sectional views of a semiconductor device 100A at various stages of manufacturing, in accordance with another embodiment. The semiconductor device 100A is similar to the semiconductor device 100, but the dielectric cap layer 117 is formed by a different amorphization process. In particular, in FIG. 8, an ion implantation process 120 is performed to convert upper portions (e.g., portions distal from the substrate 101) of the IMD layer 111 into the dielectric cap layer 117.

In accordance with some embodiments of the present disclosure, the ion implantation process is performed using a nitrogen-containing process gas, such as $NH_3$ or $N_2O$. In some embodiments, the process gas is ignited into a plasma, and ions of the process gas (e.g., ions of nitrogen) are implanted into the upper portions of the IMD layer 111 to convert the upper portions of the IMD layer 111 into the nitrogen-containing dielectric cap layer 117. In some embodiments, the dielectric cap layer 117 is a nitride-containing dielectric material, such as $SiN_x$, $SiON_x$, or $SiCN_x$, where x may be 1 or 2. A thickness of the dielectric cap layer 117 may be between about 5 angstroms and about 50 angstroms, or between about 10 angstroms and about 50 angstroms. A density of the dielectric cap layer 117 may be between about 1.5 g/cm$^3$ and about 3.2 g/cm$^3$. The dielectric cap layer 117 may have a nitrogen atomic percentage in a range between about 2 at % and about 10 at %.

In the example of FIG. 8, the lower surface 117L of the dielectric cap layer 117 is closer to the substrate 101 than the upper surface 115U of the conductive material 115 of the conductive line 112. The upper surface 117U of the dielectric cap layer 117 is level with the upper surface 115U of the conductive material 115. The upper surface 111U of the IMD layer 111 recedes below the upper surface 115U of the conductive material 115.

Next, in FIG. 9, the etch stop layer stack 118, which includes the ESLs 119, 121, 123, and 125, are formed over the metal cap layer 116 and the dielectric cap layer 117. Formation of etch stop layer stack 118 is same as or similar to that of the etch stop layer stack 118 in FIG. 2, thus details are not repeated. Note that the upper surface of the ESL 119 may be flat as illustrated by the solid line 119U in FIG. 9, or may be non-flat (e.g., curved) over the metal cap layer 116, due to, e.g., the vertical offset between the upper surface of the metal cap layer 116 and the upper surface of the dielectric cap layer 117. For example, portions of the upper surface of the ESL 119 over (e.g., directly over) the metal cap layer 116 may be curved, as illustrated by the dashed line 119U'. In subsequent figures, the upper surface of the ESL 119 is illustrated as a flat surface, with the understanding that at least portions of the upper surface of the ESL 119 may be non-flat (e.g., curved).

Next, processing steps same as or similar to those discussed above in FIGS. 4-7 are performed to form the semiconductor device 100A in FIG. 10. For simplicity, details are not repeated.

Figure 11:
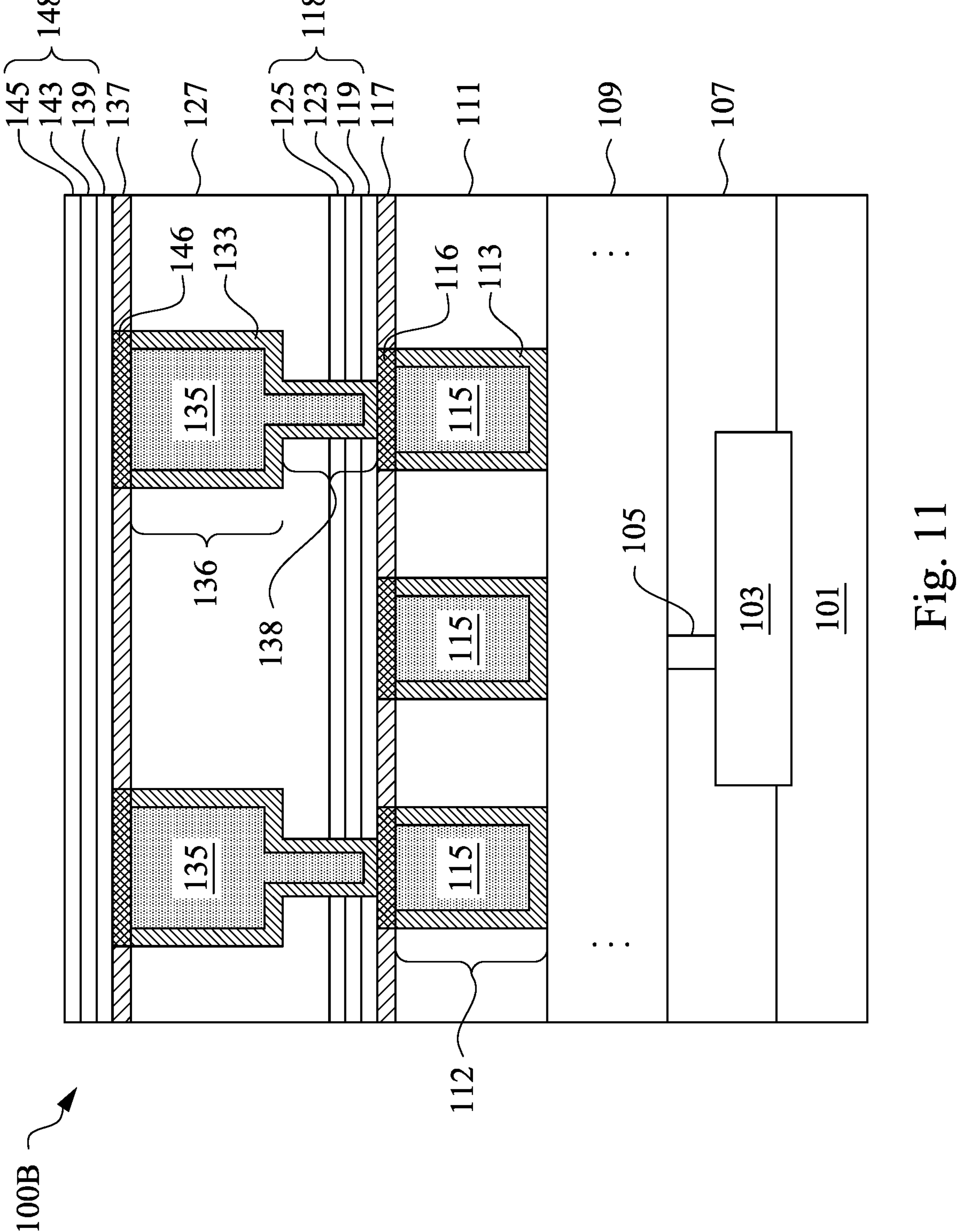
FIG. 11 illustrates a cross-sectional view of a semiconductor device, in accordance with another embodiment.

FIG. 11 illustrates a cross-sectional view of a semiconductor device 100B, in accordance with another embodiment. The semiconductor device 100B is similar to the semiconductor device 100 of FIG. 7, but the etch stop layer stacks 118 and 148 in FIG. 11 comprise three etch stop layers instead of four etch stop layers as in FIG. 7. In particular, the etch stop layer stack 118 includes the ESL 119 (e.g., AlN), the ESL 123 (e.g., ODC), and the ESL 125 (e.g., $AlO_x$). Similarly, the etch stop layer stack 148 includes the ESL 139 (e.g., AlN), the ESL 143 (e.g., ODC), and the ESL 145 (e.g., $AlO_x$).

Figure 12:
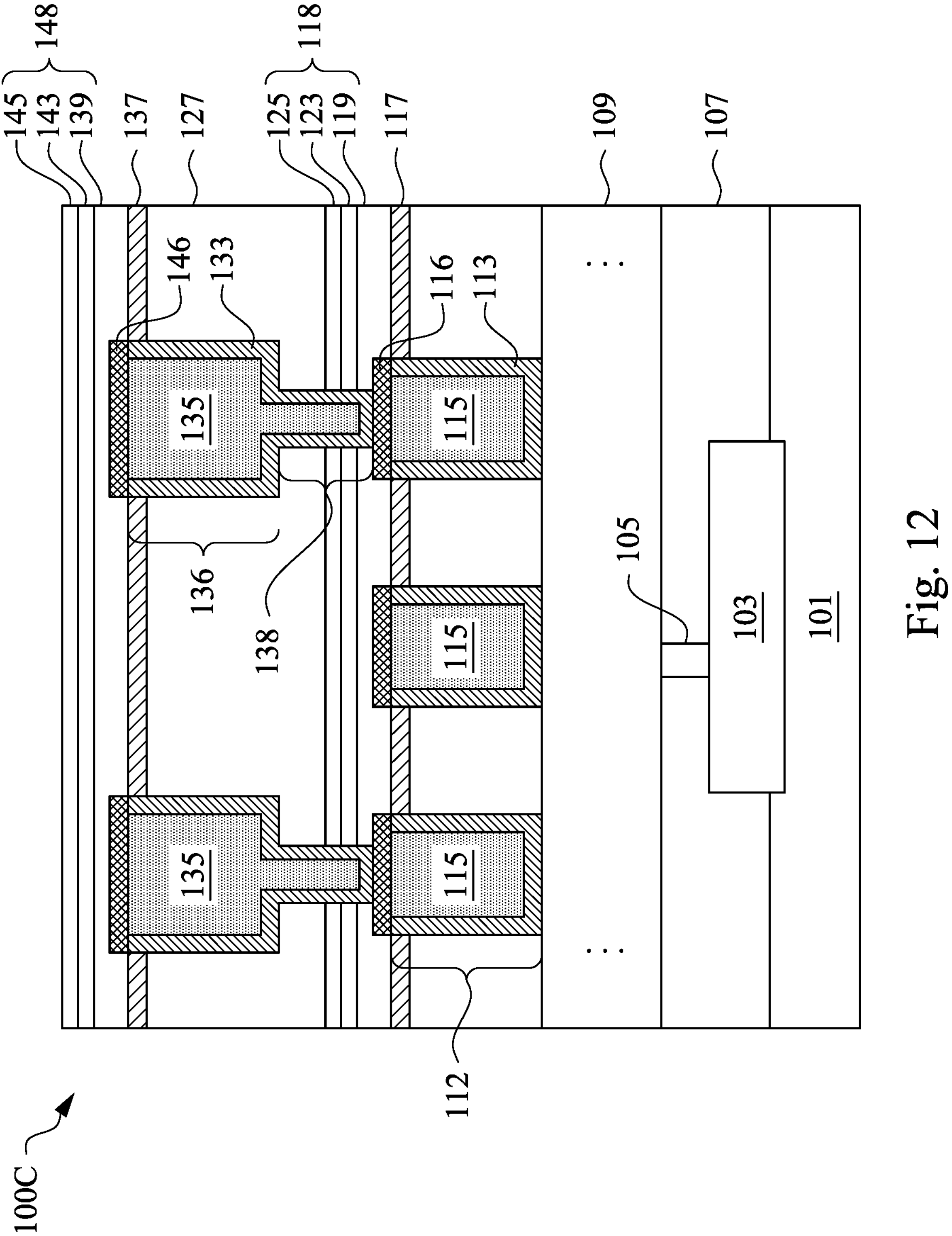
FIG. 12 illustrates a cross-sectional view of a semiconductor device, in accordance with another embodiment.

FIG. 12 illustrates a cross-sectional view of a semiconductor device 100C, in accordance with another embodiment. The semiconductor device 100C is similar to the semiconductor device 100A of FIG. 10, but the etch stop layer stacks 118 and 148 in FIG. 12 comprise three etch stop layers instead of four etch stop layers as in FIG. 10. In particular, the etch stop layer stack 118 includes the ESL 119 (e.g., AlN), the ESL 123 (e.g., ODC), and the ESL 125 (e.g., $AlO_x$). Similarly, the etch stop layer stack 148 includes the ESL 139 (e.g., AlN), the ESL 143 (e.g., ODC), and the ESL 145 (e.g., $AlO_x$). The dielectric cap layers 117 and 137 of FIG. 12 are formed by ion implantation.

Figure 13:
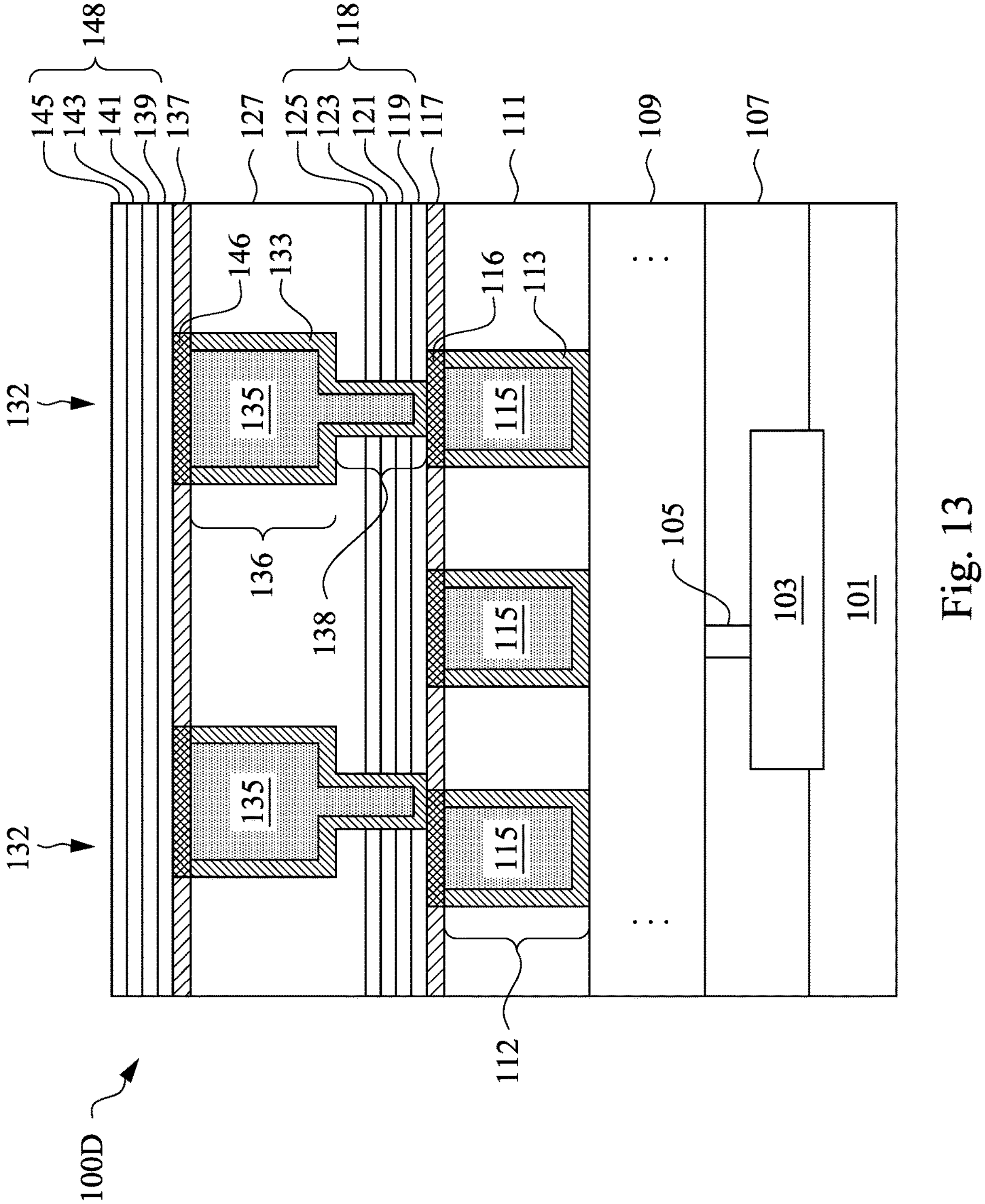
FIG. 13 illustrates a cross-sectional view of a semiconductor device, in accordance with yet another embodiment.

FIG. 13 illustrates a cross-sectional view of a semiconductor device 100D, in accordance with yet another embodiment. The semiconductor device 100D is similar to the semiconductor device 100 of FIG. 7, but at least one of the vias 138 (e.g., the via 138 on the left) is formed to be misaligned (e.g., due to mask alignment inaccuracies in the manufacturing process) with the underlying conductive line 112, such that a portion of the bottom surface of the via 138 extends beyond lateral extents (e.g., beyond sidewalls) of the conductive line 112 and contacts (e.g., physically contacts) the dielectric cap layer 117. Due to the electrical isolation provided by the dielectric cap layer 117, leakage current between the misaligned via 138 and the conductive lines 112 is reduced or prevented, in some embodiments.

Embodiments of the present disclosure achieve some advantageous features. For example, the dielectric cap layer 117 reduces leakage current paths between adjacent conductive lines 112, thus improving device performance and reducing power consumption. In addition, the Time-Dependent Dielectric Brakedown (TDDB) performance of the device is also improved. The film scheme of the etch stop layer stack (e.g., 118, 148) provides further advantages. For example, by forming amorphous etch stop layer 119, no grain boundaries exists in the etch stop layer 119 for copper atoms to migrate-through, therefore, the copper atoms are blocked from being diffused into the overlying etch stop layers and dielectric layers (e.g., 127). Since the copper atoms may cause the under-etching of the dielectric layers and the etch stop layers, the blocking of copper diffusion eliminates the under-etching, and therefore, device reliability and the manufacturing yield are improved.

Figure 14:
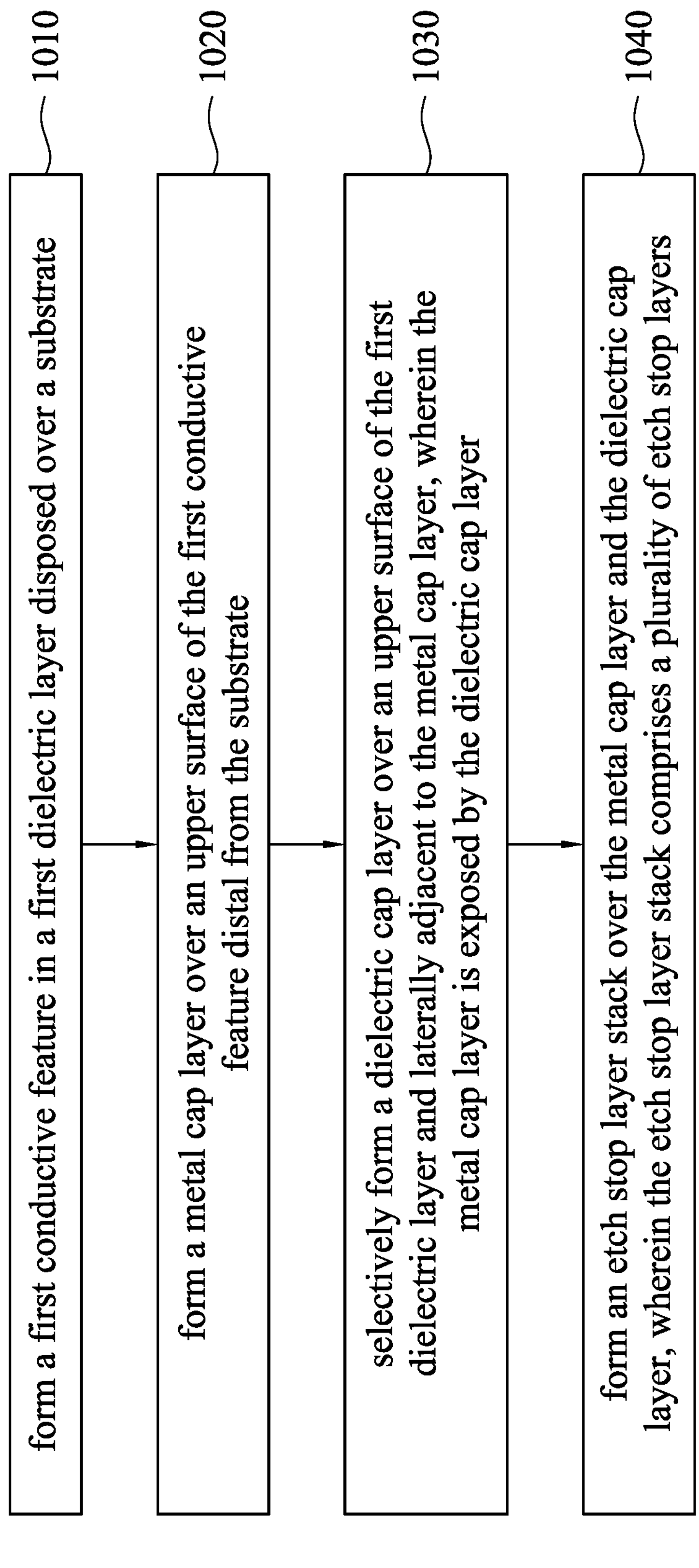
FIG. 14 illustrates a flow chart of a method of forming a semiconductor device, in accordance with some embodiments.

FIG. 14 illustrates a flow chart of a method of fabricating a semiconductor structure, in accordance with some embodiments. It should be understood that the embodiment method shown in FIG. 14 is merely an example of many possible embodiment methods. One of ordinary skill in the art would recognize many variations, alternatives, and modifications. For example, various steps as illustrated in FIG. 14 may be added, removed, replaced, rearranged, or repeated.

Referring to FIG. 14, at block 1010, a first conductive feature is formed in a first dielectric layer disposed over a substrate. At block 1020, a metal cap layer is formed over an upper surface of the first conductive feature distal from the substrate. At block 1030, a dielectric cap layer is selectively formed over an upper surface of the first dielectric layer and laterally adjacent to the metal cap layer, wherein the metal cap layer is exposed by the dielectric cap layer. At block 1040, an etch stop layer stack is formed over the metal cap layer and the dielectric cap layer, wherein the etch stop layer stack comprises a plurality of etch stop layers.

In accordance with an embodiment of the present disclosure, method of forming a semiconductor device includes: forming a first conductive feature in a first dielectric layer disposed over a substrate; forming a metal cap layer over an upper surface of the first conductive feature distal from the substrate; selectively forming a dielectric cap layer over an upper surface of the first dielectric layer and laterally adjacent to the metal cap layer, wherein the metal cap layer is exposed by the dielectric cap layer; and forming an etch stop layer stack over the metal cap layer and the dielectric cap layer, wherein the etch stop layer stack comprises a plurality of etch stop layers. In an embodiment, the method further includes: forming a second dielectric layer over the etch stop layer stack; and forming a second conductive feature in the second dielectric layer, wherein the second conductive feature extends through the etch stop layer stack and is electrically coupled to the metal cap layer. In an embodiment, forming the metal cap layer comprises selectively forming an electrically conductive material over the upper surface of the first conductive feature. In an embodiment, the dielectric cap layer is formed of a nitride-containing dielectric material. In an embodiment, the nitride-containing dielectric material is silicon nitride, silicon oxynitride, or silicon carbonitride. In an embodiment, a thickness of the dielectric cap layer is between about 10 angstroms and about 50 angstroms. In an embodiment, selectively forming the dielectric cap layer comprises selectively depositing the nitride-containing dielectric material over the upper surface of the first dielectric layer using a plasma-enhanced chemical vapor deposition (PECVD) process. In an embodiment, the PECVD process is performed using a precursor comprising $N_2$, $NH_3$, NO, or $N_2O$. In an embodiment, selectively forming the dielectric cap layer comprises converting an upper layer of the first dielectric layer into the dielectric cap layer by performing an ion implantation process. In an embodiment, the ion implantation process is performed using a gas source comprising $NH_3$ or $N_2O$. In an embodiment, forming the etch stop layer stack comprises: forming a layer of aluminum nitride over the metal cap layer and the dielectric cap layer; forming a layer of oxygen-doped silicon carbide over the layer of aluminum nitride; and forming a layer of aluminum oxide over the layer of oxygen-doped silicon carbide. In an embodiment, forming the etch stop layer stack further comprises forming another layer of aluminum oxide between the layer of aluminum nitride and the layer of oxygen-doped silicon carbide.

In accordance with an embodiment of the present disclosure, a method of forming a semiconductor device includes: forming first conductive features in a first dielectric layer disposed over a substrate, wherein first surfaces of the first conductive features distal from the substrate are level with a first surface of the first dielectric layer; selectively forming a metal cap layer on the first surfaces of the first conductive features; selectively forming a dielectric cap layer on the first surface of the first dielectric layer, wherein the dielectric cap layer is laterally adjacent to the metal cap layer, wherein the dielectric cap layer is formed of a nitride-containing dielectric material; forming a plurality of etch stop layers successively on the metal cap layer and on the dielectric cap layer; forming a second dielectric layer on the plurality of etch stop layers; and forming second conductive features in the second dielectric layer, wherein the second conductive features extend through the plurality of etch stop layers and are electrically coupled to respective ones of the first conductive features. In an embodiment, selectively forming the dielectric cap layer comprises depositing the nitride-containing dielectric material on the first surface of the first dielectric layer while keeping an upper surface of metal cap layer distal from the substrate free of the nitride-containing dielectric material, wherein the nitride-containing dielectric material extends continuously between adjacent ones of the first conductive features. In an embodiment, selectively forming the dielectric cap layer comprises converting an upper portion of the first dielectric layer proximate to the first surface of the first dielectric layer into the dielectric cap layer by an ion implantation process. In an embodiment, forming the plurality of etch stop layers comprises: forming a first etch stop layer comprising aluminum nitride over the metal cap layer and the dielectric cap layer; forming a second etch stop layer comprising oxygen-doped silicon carbide over the first etch stop layer; and forming a third etch layer comprising aluminum oxide over the second etch stop layer. In an embodiment, forming the second conductive features comprises: forming conductive lines in the second dielectric layer; and forming vias underlying the conductive lines, wherein upper portions of the vias are in the second dielectric layer, and lower portions of the vias extend through the plurality of etch stop layers and are electrically coupled to the first conductive features.

In accordance with an embodiment of the present disclosure, a semiconductor device includes: a substrate; a first dielectric layer over the substrate; a first conductive feature in the first dielectric layer; a metal cap layer on the first conductive feature; a dielectric cap layer on an upper surface of the first dielectric layer distal from the substrate, wherein the dielectric cap layer is laterally adjacent to the metal cap layer, wherein the dielectric cap layer comprises a nitride-containing dielectric material, wherein an upper surface of the metal cap layer distal from the substrate is free of the dielectric cap layer; an etch stop layer stack on the metal cap layer and the dielectric cap layer, wherein the etch stop layer stack comprises a plurality of etch stop layers; a second dielectric layer on the etch stop layer stack; and a second conductive feature in the second dielectric layer, wherein the second conductive feature extends through the etch stop layer stack and is electrically coupled to the first conductive feature. In an embodiment, the etch stop layer stack comprises: a first etch stop layer comprising aluminum nitride over the metal cap layer and the dielectric cap layer; a second etch stop layer comprising oxygen-doped silicon carbide over the first etch stop layer; and a third etch layer comprising aluminum oxide over the second etch stop layer. In an embodiment, the second conductive feature comprises: a metal line in the second dielectric layer, wherein a lower surface of the meta line facing the substrate is spaced apart from the etch stop layer stack; and a via underlying and connected to the metal line, wherein the via extends through the etch stop layer stack and contacts the metal cap layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:

a substrate;

a first dielectric layer over the substrate;

a first conductive feature in the first dielectric layer, wherein an upper surface of the first conductive feature distal from the substrate extends further from the substrate than an upper surface of the first dielectric layer distal from the substrate;

a metal cap layer on the first conductive feature;

a dielectric cap layer on the upper surface of the first dielectric layer, wherein the dielectric cap layer is laterally adjacent to the metal cap layer, wherein the dielectric cap layer comprises a nitride-containing dielectric material, wherein an upper surface of the metal cap layer distal from the substrate is free of the dielectric cap layer;

an etch stop layer stack on the metal cap layer and the dielectric cap layer, wherein the etch stop layer stack comprises a plurality of etch stop layers;

a second dielectric layer on the etch stop layer stack; and a second conductive feature in the second dielectric layer, wherein the second conductive feature extends through the etch stop layer stack and is electrically coupled to the first conductive feature.

2. The semiconductor device of claim 1, wherein the etch stop layer stack comprises:

a first etch stop layer comprising aluminum nitride over the metal cap layer and the dielectric cap layer;

a second etch stop layer comprising oxygen-doped silicon carbide over the first etch stop layer; and a third etch stop layer comprising aluminum oxide over the second etch stop layer.

3. The semiconductor device of claim 2, wherein the etch stop layer stack further comprises a fourth etch stop layer comprising aluminum oxide between the first etch stop layer and the second etch stop layer.

4. The semiconductor device of claim 1, wherein the nitride-containing dielectric material is silicon nitride, silicon oxynitride, or silicon carbonitride.

5. The semiconductor device of claim 4, wherein a concentration of nitride in the dielectric cap layer is between about 2 at % and about 10 at %.

6. The semiconductor device of claim 5, wherein a thickness of the dielectric cap layer is between about 10 angstroms and about 50 angstroms.

7. The semiconductor device of claim 1, wherein the second conductive feature comprises:

a conductive line in the second dielectric layer; and a via underlying and connected to the conductive line, wherein the via extends through the etch stop layer stack and contacts the metal cap layer.

8. The semiconductor device of claim 7, wherein an upper portion of the via is in the second dielectric layer, and a lower portion of the via extends through the plurality of etch stop layers and contacts the first conductive feature.

9. A semiconductor device comprising:

a first dielectric layer over a substrate;

a first conductive feature in the first dielectric layer;

a conductive cap layer on a first surface of the first conductive feature distal from the substrate;

a dielectric cap layer on a first surface of the first dielectric layer distal from the substrate, wherein the dielectric cap layer is laterally adjacent to the conductive cap layer, wherein the conductive cap layer is exposed by the dielectric cap layer, wherein the first surface of the first conductive feature extends further from the substrate than the first surface of the first dielectric layer;

an etch stop layer stack on the conductive cap layer and the dielectric cap layer, wherein the etch stop layer stack comprises a plurality of etch stop layers;

a second dielectric layer on the etch stop layer stack; and a second conductive feature in the second dielectric layer and electrically coupled to the first conductive feature.

10. The semiconductor device of claim 9, wherein a width of the conductive cap layer is the same as a width of the first conductive feature such that sidewalls of the conductive cap layer are aligned with respective sidewalls of the first conductive feature.

11. The semiconductor device of claim 10, wherein the conductive cap layer is an electrically conductive material, wherein the dielectric cap layer is a nitride-containing dielectric material.

12. The semiconductor device of claim 11, wherein the conductive cap layer has a chemical composition that is free of nitrogen.

13. The semiconductor device of claim 11, wherein a concentration of nitride in the nitride-containing dielectric material is between about 2 at % and about 10 at %.

14. The semiconductor device of claim 13, wherein the nitride-containing dielectric material is silicon nitride, silicon oxynitride, or silicon carbonitride.

15. The semiconductor device of claim 9, wherein the etch stop layer stack comprises:

a first etch stop layer comprising aluminum nitride over the conductive cap layer and the dielectric cap layer;

a second etch stop layer comprising oxygen-doped silicon carbide over the first etch stop layer; and a third etch stop layer comprising aluminum oxide over the second etch stop layer.

16. The semiconductor device of claim 15, wherein the etch stop layer stack further comprises a fourth etch stop layer comprising aluminum oxide, wherein the fourth etch stop layer is between the first etch stop layer and the second etch stop layer.

17. The semiconductor device of claim 9, wherein the second conductive feature extends through the etch stop layer stack and contacts the first conductive feature.

18. A semiconductor device comprising:

a substrate;

a first dielectric layer over the substrate;

a conductive line in the first dielectric layer;

a conductive cap layer on an upper surface of the conductive line distal from the substrate;

a dielectric cap layer on an upper surface of the first dielectric layer and laterally adjacent to the conductive cap layer, wherein an upper surface of the conductive cap layer distal from the substrate is free of the dielectric cap layer; and an etch stop layer stack on the conductive cap layer and the dielectric cap layer, wherein the etch stop layer stack comprises:

a first sublayer comprising aluminum nitride and disposed over the conductive cap layer and the dielectric cap layer;

a second sublayer comprising aluminum oxide and disposed over the first sublayer;

a third sublayer comprising oxygen-doped silicon carbide and disposed over the second sublayer; and a fourth sublayer comprising aluminum oxide and disposed over the third sublayer.

19. The semiconductor device of claim 18, wherein the dielectric cap layer is a nitride-containing dielectric material, wherein a chemical composition of the conductive cap layer is free of nitrogen.

20. The semiconductor device of claim 18, wherein the first dielectric layer and the conductive line have a coplanar upper surface distal from the substrate.

* * * * *